(12) United States Patent
Kim et al.

(10) Patent No.: US 9,588,413 B2
(45) Date of Patent: Mar. 7, 2017

(54) PHOTOMASK, METHOD OF CORRECTING ERROR THEREOF, INTEGRATED CIRCUIT DEVICE MANUFACTURED BY USING THE PHOTOMASK, AND METHOD OF MANUFACTURING THE INTEGRATED CIRCUIT DEVICE

(71) Applicant: Samsung Electronics Co., Ltd., Suwon-si (KR)

(72) Inventors: Sang-hyun Kim, Hwaseong-si (KR); Seong-sue Kim, Seoul (KR); Dong-gun Lee, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/258,163

(22) Filed: Sep. 7, 2016

(65) Prior Publication Data

US 2016/0377973 A1 Dec. 29, 2016

Related U.S. Application Data

(62) Division of application No. 14/565,087, filed on Dec. 9, 2014, now Pat. No. 9,465,286.

(30) Foreign Application Priority Data

Dec. 9, 2013 (KR) .......................... 10-2013-0152651

(51) Int. Cl.
*G03F 1/24* (2012.01)
*G03F 1/38* (2012.01)
*G03F 1/72* (2012.01)
*G03F 1/74* (2012.01)

(52) U.S. Cl.
CPC .................. *G03F 1/24* (2013.01); *G03F 1/38* (2013.01); *G03F 1/72* (2013.01); *G03F 1/74* (2013.01)

(58) Field of Classification Search
CPC ..... G03F 1/24; G03F 1/38; G03F 1/72; G03F 1/74
USPC ...................................... 430/5, 30
See application file for complete search history.

(56) References Cited

U.S. PATENT DOCUMENTS

| 6,841,786 | B2 | 1/2005 | Kamm |
| 7,771,898 | B2 | 8/2010 | Masaki et al. |
| 8,142,958 | B2 | 3/2012 | Holfeld |
| 8,187,774 | B2 | 5/2012 | Jeong |
| 8,329,361 | B2 | 12/2012 | Hosoya |
| 2002/0076625 | A1 | 6/2002 | Shoki et al. |
| 2006/0222961 | A1 | 10/2006 | Yan |
| 2007/0042276 | A1 | 2/2007 | Bae |
| 2009/0017387 | A1 | 1/2009 | Shoki |
| 2013/0100428 | A1 | 4/2013 | Ruoff et al. |

FOREIGN PATENT DOCUMENTS

| JP | 08-257780 | 10/1996 |
| KR | 10-2006-0007656 A | 1/2006 |
| KR | 10-2007-0111203 A | 11/2007 |
| KR | 10-2009-0032802 A | 4/2009 |
| KR | 10-2009-0047009 A | 5/2009 |
| KR | 10-2010-0096777 A | 9/2010 |
| KR | 10-2011-0009375 A | 1/2011 |
| KR | 10-2013-0006746 A | 1/2013 |

*Primary Examiner* — Christopher Young
(74) *Attorney, Agent, or Firm* — Muir Patent Law, PLLC

(57) ABSTRACT

Provided are a photomask and a method of correcting errors thereof. The photomask includes a multilayer reflection film covering one side surface of a substrate and an energy receiving layer covering the other side surface of the substrate. The method includes determining a local correction position on a frontside surface of the photomask according to a detected error of the photomask, and locally applying an energy beam to a backside surface region of the photomask aligned with the local correction position in a thickness direction of the photomask. The invention may be applicable to structures other than photomasks that benefit from modification of surface heights or selectively applied stress.

18 Claims, 21 Drawing Sheets

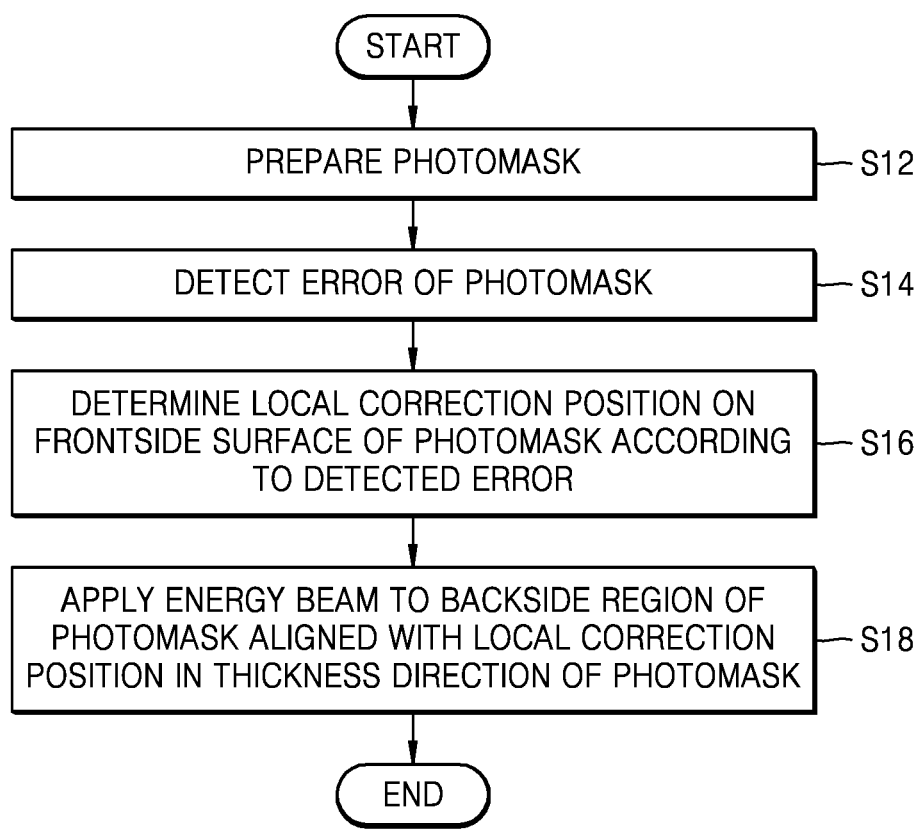

BACKSIDE

BEFORE CORRECTION

Peak-to-valley : 198 nm
3sigma : 146 nm

AFTER CORRECTION

Peak-to-valley : 162 nm
3sigma : 125 nm

PHOTOMASK, METHOD OF CORRECTING ERROR THEREOF, INTEGRATED CIRCUIT DEVICE MANUFACTURED BY USING THE PHOTOMASK, AND METHOD OF MANUFACTURING THE INTEGRATED CIRCUIT DEVICE

CROSS-REFERENCE TO RELATED APPLICATIONS

This application is a Divisional of and claims priority to U.S. patent application Ser. No. 14/565,087 filed on Dec. 9, 2014 which claims the benefit of Korean Patent Application No. 10-2013-0152651, filed on Dec. 9, 2013, in the Korean Intellectual Property Office, the disclosure of each of which is incorporated herein in its entirety by reference.

BACKGROUND

The inventive concept relates to methods for correcting a shape of a device, such as a surface curvature, warpage or flatness, products including structure to correct their shape and methods of manufacture related thereto. The disclosure describes photomasks, methods of correcting errors of the photomask, integrated circuit devices manufactured using the photomask, and methods of manufacturing integrated circuit devices, including examples of a photomask that may be used with an extreme ultraviolet (EUV) photolithography process, a method of correcting errors of the photomask, an integrated circuit device manufactured by using the photomask, and a method of manufacturing an integrated circuit device by using the photomask.

Recently, the wavelength of light used in an exposure process has been decreased as the design rules of semiconductor devices continue to decrease. Extreme ultraviolet (EUV) light may be used in an exposure process. In particular, an EUV lithography process using EUV light having a wavelength of about 10 nm to about 14 nm may be used to mass-produce 40 nm or less nano-scale semiconductor devices. In order to form a plurality of high-density micro patterns by using an EUV lithography process, extensive research has been conducted to develop a technology for transferring a pattern onto a wafer by using a reflective exposure system including a reflective EUV photomask. A pattern on a reflective photomask is transferred onto a wafer through a scanning process. Therefore, a defect of the photomask may cause a defect of a device embodied on the wafer. Various errors may occur in the reflective photomask. Therefore, there is a need to effectively correct various errors of a photomask.

SUMMARY

The inventive concept provides devices configurable to alter a shape of their surface and methods of manufacturing using these devices. The embodiments described herein include a photomask that includes a stress inducing layer that may alter a shape of the photomask, such as a reflective surface of the photomask. Embodiments described also include a method of manufacturing including altering a shape of a photomask and using the photomask to pattern a target layer to produce an integrated circuit device.

The embodiments may be used with an extreme ultraviolet (EUV) photolithography process, wherein errors of the photomask may be minimized errors in order to prevent a wafer overlay error.

According to some embodiments, a photolithographic mask comprises a substrate having a first surface and a second surface on an opposite side of the substrate from the first surface; a reflection film on the first surface of the substrate; a light absorber layer on the reflection film; and a stress inducing layer on the second surface of the substrate, the stress inducing layer configured to have selected locations alter a stress applied to the substrate to alter a shape of the photolithographic mask.

The stress inducing layer comprises an amorphous material and/or a crystalline material.

The stress inducing layer may comprise a plurality of layers of a first material and a plurality of layers of a second material each interposed between corresponding ones of the plurality of layers of the first material. The first material may comprise at least one of Al, Si and K. The second material comprises at least one of Nb, Mo, Ru and Pb.

The first material may comprise an amorphous portion and a crystalline portion.

Each layer of the plurality of layers of the first material may comprise an amorphous portion and a crystalline portion. The crystalline portions of the plurality of layers of the first material may provide stress to the substrate.

Each layer of the plurality of layers of the second material may comprise an amorphous portion and a crystalline portion.

The stress inducing layer may comprise one or more depressions on a first surface, the one or more depressions corresponding to locations that induce stress on the substrate.

The stress inducing layer may comprise a first surface adjacent the second surface of the substrate and a second surface on an opposite side of the stress inducing layer from the first surface, and the one or more depressions may be located on the second surface.

The stress inducing layer may comprise a first material having a crystalline state between each of the one or more depressions and the substrate and having an amorphous state at other locations.

The light absorbing layer may be patterned to include openings to allow light to impinge on and reflect off of the reflection film.

According to some embodiments, a method of manufacture comprises providing a photolithographic mask including a substrate having a first surface and a second surface on an opposite side of the substrate from the first surface, a reflection film on the first surface of the substrate, a light absorbing layer on the reflection film, and a stress inducing layer on the second surface of the substrate; detecting a deviation of the photolithographic mask; and in response to the detected deviation, altering a state of one or more selected portions of the stress inducing layer to alter stress applied to the substrate by the stress inducing layer and thereby alter a shape of the photolithographic mask.

Detecting a deviation of the photolithographic mask may include detecting a deviation of a surface of the photolithographic mask from a target location.

Altering the state of one or more selected portions may comprise converting an amorphous state of a material of the stress inducing layer to a crystalline state.

Altering the state of one or more selected portions may comprise providing an energy beam to the one or more selected portions of the stress inducing layer. The energy beam may be one of an electron beam, a focused ion beam, a laser beam and an electromagnetic beam.

The stress inducing layer may comprise a plurality of layers of a first material and a plurality of layers of a second material each interposed between corresponding ones of the plurality of layers of the first material. Altering the state of one or more selected portions may comprise converting an amorphous state of at least some of the plurality of layers of the first material and at least some of the plurality of layers of the second material to a crystalline state.

The first material may comprise at least one of Al, Si and K. The second material may comprise at least one of Nb, Mo, Ru and Pb.

Altering the state of one or more selected portions may comprise creating an indentation of the stress inducing layer at the one or more selected portions.

The shape of the photolithographic mask may be altered to reduce a warpage of the photolithographic mask. The shape of the photolithographic mask may be altered to increase a flatness of the photolithographic mask.

The method may also comprise creating a semiconductor device including exposing a wafer with light reflected from the photolithographic mask.

Detecting a deviation of the photolithographic mask may comprise obtaining a registration map of the photolithographic mask.

The registration map may include a plurality of measurements of a shift amount and a shift direction of a corresponding plurality of pattern elements of the photolithographic mask. The shape of the photolithographic mask may be altered to reduce the effect of the shift amount of one or more pattern elements. The shape of the photolithographic mask may be altered to align shift directions of neighboring pattern elements.

The light absorbing layer may be patterned to include openings to allow light to impinge on and reflect off of the reflection film.

One or more deviations of the photomask may be detected and the shape of the photomask may be altered in response to the detected one or more deviations.

Detecting one or more deviations of the photomask comprises detecting a deviation in the patterned photoresist layer. Detecting one or more deviations of the photomask may comprise detecting a deviation in another patterned photoresist layer formed by exposing the another patterned photoresist layer to light reflected from the photomask.

The exposing of the photoresist layer may include exposing the photoresist film by using extreme ultraviolet (EUV) light reflected from the photomask.

According to another aspect of the inventive concept, there is provided an integrated circuit device manufactured by using the disclosed photomasks.

BRIEF DESCRIPTION OF THE DRAWINGS

Exemplary embodiments of the inventive concept will be more clearly understood from the following detailed description taken in conjunction with the accompanying drawings in which:

FIG. 3 is a flowchart of a method of correcting errors of a photomask, according to embodiments of the inventive concept;

DETAILED DESCRIPTION OF THE EMBODIMENTS

Figure 1A:
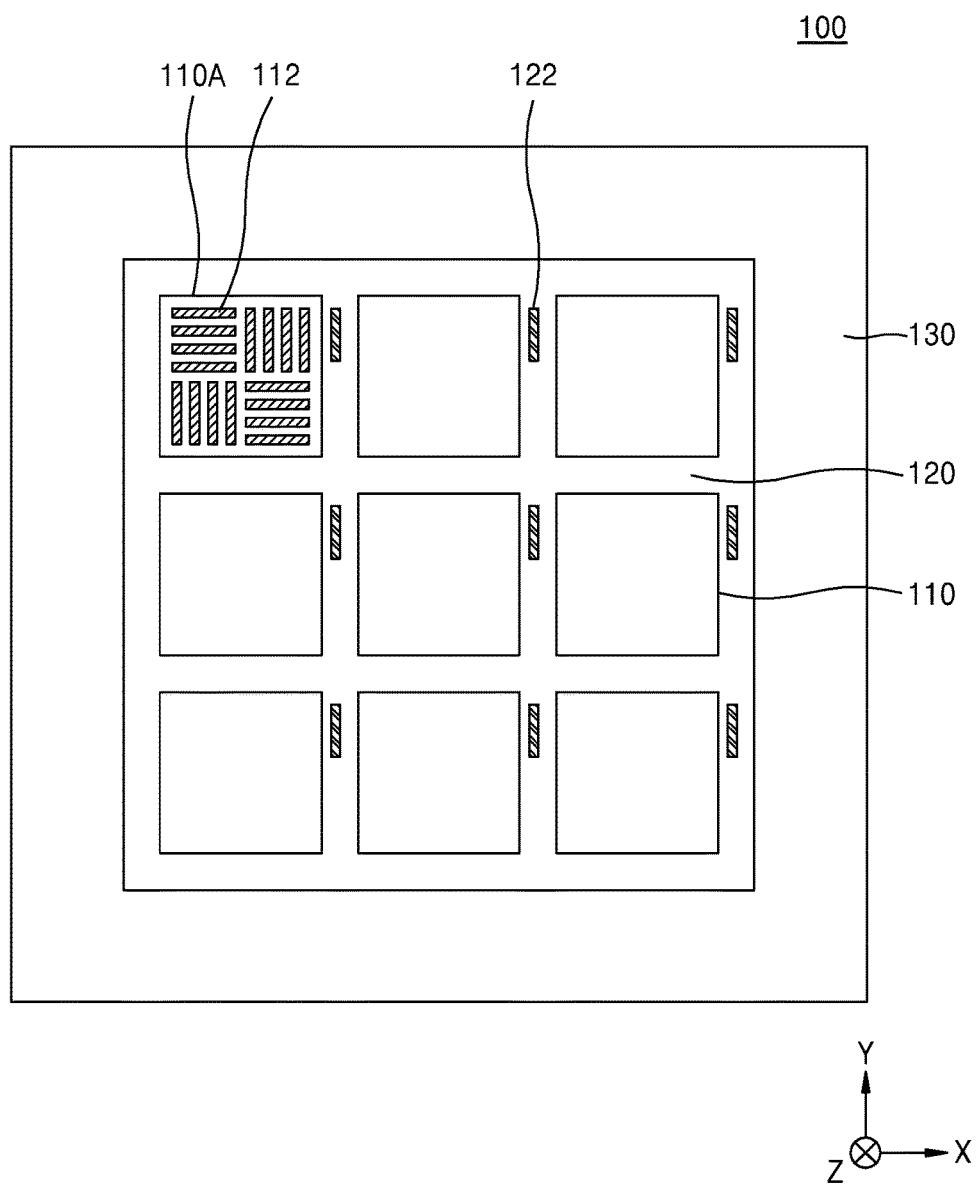
FIGS. 1A and 1B are respectively a plan view and a cross-sectional view illustrating a schematic structure of a photomask according to embodiments of the inventive concept.

As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the inventive concept will be described in detail with reference to the accompanying drawings. Like reference numerals in the drawings denote like elements, and thus their redundant description will be omitted.

The inventive concept will now be described more fully with reference to the accompanying drawings, in which example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that although the terms "first", "second", etc. are used herein to describe members, regions, layers, portions, sections, components, and/or elements in embodiments of the inventive concept, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concept. For example, a first element may also be referred to as a second element, and similarly, a second element may also be referred to as a first element, without departing from the scope of the inventive concept.

Unless otherwise defined, all terms (including technical and scientific terms) used herein have the same meanings as commonly understood by those of ordinary skill in the art to which the inventive concept pertains. It will also be understood that terms such as those defined in commonly used dictionaries should be interpreted as having meanings that are consistent with their meanings in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the embodiments of the inventive concept should not be construed as being limited to the particular shapes of regions illustrated herein but may be to include deviations in shapes that result, for example, from manufacturing.

Figure 1B:
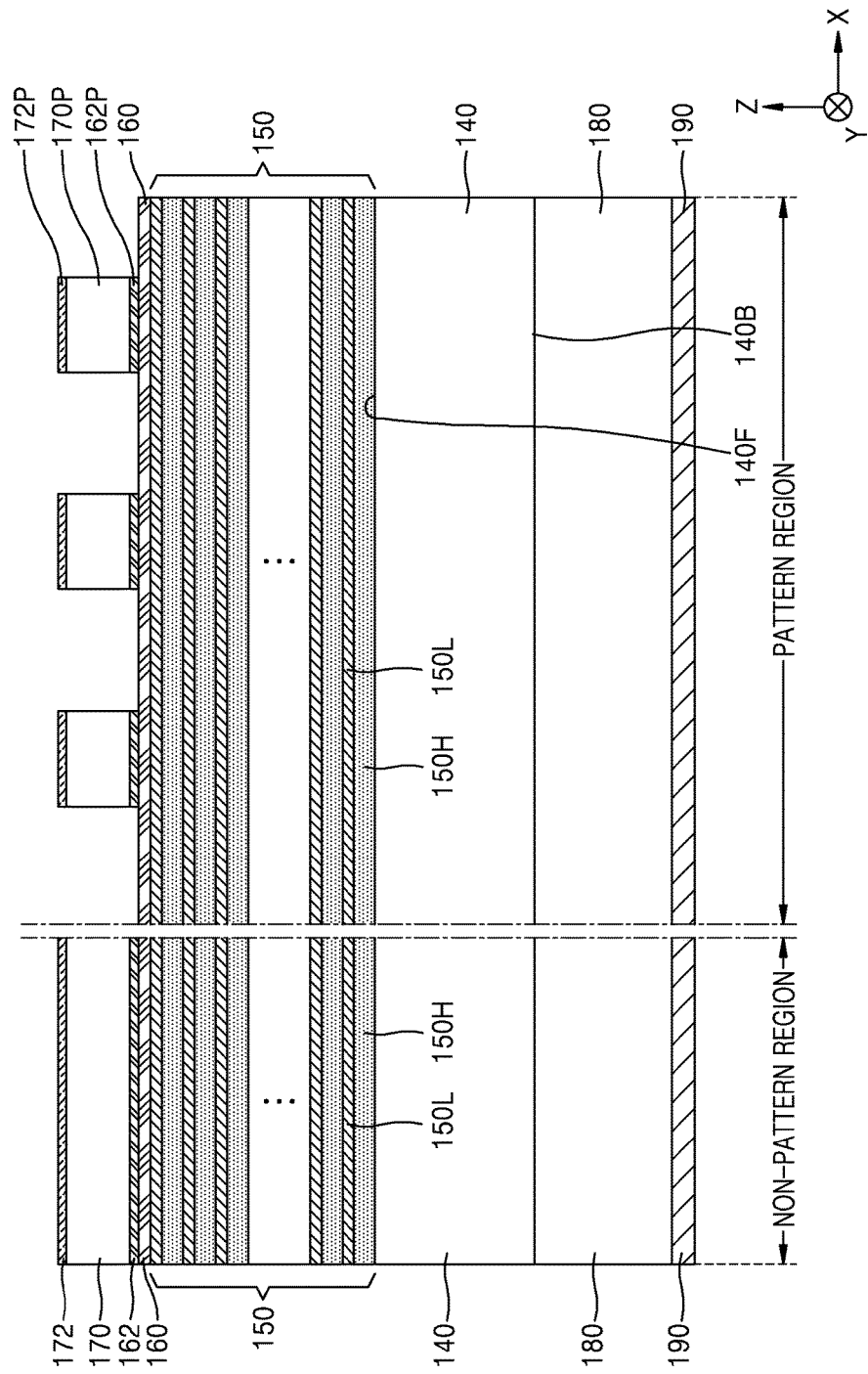

FIGS. 1A and 1B are respectively a plan view and a cross-sectional view illustrating a schematic structure of a photomask according to embodiments of the inventive concept. FIGS. 1A and 1B illustrate a reflective photomask 100 that is used to manufacture an integrated circuit device such as a semiconductor device by transferring a pattern onto a wafer (not illustrated) through an exposure process.

In some embodiments, the photomask 100 is a reflective photomask that may be used in a photolithography process. For example, a beam with an exposure wavelength within an extreme ultraviolet (EUV) wavelength range, such as a wavelength of about 13.5 nm may be used to irradiate the photomask 100.

Referring to FIGS. 1A and 1B, the photomask 100 includes a main pattern region 110 that is used to transfer a main pattern to form a unit device constituting an integrated circuit in a chip region on a wafer, an auxiliary pattern region 120 that is used to transfer an auxiliary pattern to a scribe lane region on the wafer, and a black border region 130 that surrounds the main pattern region 110 and the auxiliary pattern region 120.

The photomask 100 may include a pattern region and a non-pattern region that have cross-sectional structures illustrated in FIG. 1B. In particular, the black border region 130 includes a non-pattern region that does not include a pattern element for transferring a pattern on the wafer. The auxiliary pattern region 120 may include a pattern region and a non-pattern region illustrated in FIG. 1B. Auxiliary pattern elements 122 may be formed in the auxiliary pattern region 120. Herein, the auxiliary pattern elements 122 are used to transfer auxiliary patterns (e.g., align key patterns) that are necessary in a manufacturing process for the integrated circuit, but are not left in a final product of the integrated circuit, to the scribe lane region on the wafer. The non-pattern region of the auxiliary pattern region 120 does not include a pattern element to be transferred onto the wafer.

At least a portion of the main pattern region 110 corresponds to a pattern region in which main pattern elements, which constitute a main pattern for transferring a pattern necessary to construct the integrated circuit in the chip region on the wafer, are formed. For convenience of description and illustration, FIG. 1A illustrates that the main pattern elements 112 are included only in a main pattern region 110A among a plurality of main pattern regions 110 included in the photomask 100; however, the inventive concept is not limited thereto. The invention may be implemented with other types of photomasks with different layout features, as well as other structures other than photomasks, as will be apparent.

In some embodiments, all regions of any main pattern region 110 among the main pattern regions 110 may correspond to a pattern region in which the main pattern elements 112 are formed. In other embodiments, a partial region of any main pattern region 110 among the main pattern regions 110 may correspond to the pattern region, and another partial region thereof may correspond to a non-pattern region in which the main pattern elements 112 are not formed.

In some embodiments, the non-pattern region of the photomask 100 illustrated in FIG. 1B may be part of the black border region 130 that does not include a pattern element to be transferred onto the wafer. In other embodiments, the non-pattern region of the photomask 100 illustrated in FIG. 1B may be part of the auxiliary pattern region 120 that does not include an auxiliary pattern element to be transferred onto the wafer. In other embodiments, the non-pattern region of the photomask 100 illustrated in FIG. 1B may be a part of the main pattern region 110 that does not include a pattern to be transferred to the chip region on the wafer.

In some embodiments, the main pattern region 110 may be fully patterned and not include a non-pattern region. Also, the non-pattern region of FIG. 1B may be a portion of at least one of the auxiliary pattern region 120 and the black border region 130. In some embodiments, the main pattern region 110 may substantially fully occupy the entire photomask so that no auxiliary pattern region is provide, although a black border region 130 may be provided.

In some embodiments, the pattern region of the photomask 100 illustrated in FIG. 1B may correspond to a portion of the main pattern region 110 that includes the main pattern element 112. In other embodiments, the pattern region of the photomask 100 illustrated in FIG. 1B may correspond to a portion of the auxiliary pattern region 120 that includes the auxiliary pattern element 122.

Referring to FIGS. 1A and 1B, the photomask 100 includes a photomask substrate 140 including the main pattern region 110, the auxiliary pattern region 120, and the black border region 130.

The photomask substrate 140 may include a dielectric, glass, semiconductor, or metal material. In some embodiments, the photomask substrate 140 may include a material having a low thermal expansion coefficient. For example, the photomask substrate 140 may have a thermal expansion coefficient of about 0±0.05×10$^{-7}$/° C. at about 20° C. The photomask substrate 140 may include a material that provides excellent smoothness and excellent flatness and has excellent resistance against a cleaner. For example, the photomask substrate 140 may include fused quartz glass, quartz glass, alumino-silicate glass, soda-lime glass, low thermal expansion material (LTEM) glass such as silicon oxide-titanium oxide (SiO$_2$-TiO$_2$)-based glass, crystallized glass with β-quartz solid solution, monocrystalline silicon, or silicon carbide (SiC).

The photomask substrate 140 includes a frontside first surface 140F and a backside second surface 140B. In some embodiments, the first surface 140F may have a flatness of about 50 nm or less, and the second surface 140B may have a flatness of about 500 nm or less. As used herein, "flatness" refers to a maximum deviation from a surface or plane. Also, the first surface 140F and the second surface 140F of the photomask substrate 140 may have a root mean square (RMS) surface roughness of about 0.15 nm, but are not limited thereto.

As illustrated in FIG. 1B, in order to reflect exposure light, for example, EUV light, a multilayer reflection film 150, a capping layer 160, a buffer layer 162, a light absorber layer 170, and a low-reflection layer 172 may be sequentially formed on the first surface 140F of the photomask substrate 140 in the non-pattern region of the photomask 100. In some embodiments, at least one of the buffer layer 162 and the low-reflection layer 172 may be omitted.

An energy receiving layer 180 covering at least a portion of the photomask substrate 140 and a backside conductive film 190 covering an energy receiving layer 180 are formed on the second surface 140B of the photomask substrate 140.

As in the non-pattern region of the photomask 100, in the pattern region of the photomask 100, the multilayer reflection film 150 and the capping layer 160 are sequentially formed on the first surface 140F of the photomask substrate 140, and the energy receiving layer 180 and the backside conductive layer 190 are sequentially formed on the second surface 140B of the photomask substrate 140. Also, pattern elements of predetermined shapes, for example, a buffer pattern 162P, a light absorber pattern 170P, and a low-reflection pattern 172P are sequentially formed on the capping layer 160 on the first surface 140F of the photomask substrate 140 to define the main pattern element 112 located in the main pattern region 110 and the auxiliary pattern element 122 located in the auxiliary pattern region 120. At least one of the buffer pattern 162P and the low-reflection pattern 172P may be omitted.

The multilayer reflection film 150 has a multilayer mirror structure that is formed by alternately stacking a high-refraction layer 150H and a low-refraction layer 150L a plurality of times. For example, the multilayer reflection film 150 may have a multilayer structure that is formed by stacking the high-refraction layer 150H and the low-refraction layer 150L repeatedly such as about 20 to 60 times (to provide 20 to 60 layers of each of the high-refraction layer 150H and the low-refraction layer 150L). In some embodiments, the multilayer reflection film 150 may include a molybdenum/silicon (Mo/Si) periodic multilayer film, a Mo compound/Si compound periodic multilayer film, a ruthenium/silicon (Ru/Si) periodic multilayer film, a beryllium/molybdenum (Be/Mo) periodic multilayer film, a silicon/niobium (Si/Nb) periodic multilayer film, a Si/Mo/Ru periodic multilayer film, a Si/Mo/Ru/Mo periodic multilayer film, or a Si/Ru/Mo/Ru periodic multilayer film.

The materials of the multilayer reflection film 150 and the thickness of each layer may be selected suitably according to a wavelength band of an applied EUV light or a required EUV light reflectance of the multilayer reflection film 150. For example, when the multilayer reflection film 150 includes a Mo/Si periodic multilayer film, a Mo layer corresponding to the low-refraction layer 150L included in the multilayer reflection film 150 and a Si layer corresponding to the high-refraction layer 150H included in the multilayer reflection film 150 may each be formed to have a thickness of about 2 nm to about 5 nm.

The multilayer reflection film 150 may be formed by direct current (DC) sputtering, radio frequency (RF) sputtering, or ion beam sputtering. For example, when the Mo/Si multilayer reflection film is formed by ion beam sputtering, a Si film and a Mo film may be formed by about 40 to 50 cycles, wherein one cycle includes depositing a Si film by using an Si target as a target and using an argon (Ar) gas as a sputter gas and depositing a Mo film by using a Mo target as a target and using an Ar gas as a sputter gas.

The capping layer 160 may prevent the surface of the multilayer reflection film 150 from being oxidized. Also, the capping layer 160 may protect the multilayer reflection film 150 from being damaged while the light absorber layer 170 is dry-etched to form pattern elements to be transferred onto the wafer in the pattern region during a manufacturing process of the photomask 100.

In some embodiments, the capping layer 160 may include Ru or a Ru alloy. When the capping layer 160 is formed of a Ru alloy, the Ru alloy may be an alloy including one selected from the group of Ru, Nb, zirconium (Zr), Mo, yttrium (Y), boron (B), lanthanum (La), and any combination thereof. Since the capping layer 160 is formed of a material having a low EUV light absorptance, the multilayer reflection film 150 may be covered by the capping layer 160 in a partial region of the patient region of the photomask 100 that is not covered by the light absorber pattern 170P, as illustrated in FIG. 1B.

In other embodiments, the capping layer 160 may include a Si film. The capping layer 160 including a Si film may have a native oxide film formed on a surface thereof. In other embodiments, when the multilayer reflection film 150 is a Mo/Si multilayer reflection film, an uppermost layer of the multilayer reflection film 150 may be a Si film, and the Si uppermost layer may function as the capping layer 160. In this case, a process of forming the capping layer 160 may be omitted.

In some embodiments, the capping layer 160 may have a thickness of about 0.5 nm to about 10 nm.

Also, the buffer layer 162 may protect the multilayer reflection film 150 from being damaged while the light absorber layer 170 is dry-etched to form pattern elements to be transferred onto the wafer in the pattern region during the manufacturing process of the photomask 100. Also, the buffer layer 162 may protect the multilayer reflection film 150 in a defect correcting process that is performed when a black defect or a white defect occurs in the pattern region during the manufacturing process of the photomask 100.

The buffer layer 162 and the buffer pattern 162P may include a material having a very low EUV light absorptance. In some embodiments, the buffer layer 162 and the buffer pattern 162P may include Ru, RuB, RuSi, chromium (Cr), Cr nitride, Al, Al nitride, tantalum (Ta), Ta nitride, $SiO_2$, $Si_3N_4$, $Al_2O_3$, or any combination thereof.

The buffer layer 162 (including the buffer pattern 162P) may be formed to a thickness of about 1 nm to about 100 nm. For example, when the buffer layer 162 includes a material having a relatively high EUV light absorptance, the buffer layer 162 may be removed from a partial region of the pattern region of the photomask 100 that is not covered by the light absorber pattern 170P, and the buffer pattern 162P may be left only under the light absorber pattern 170P, as illustrated in FIG. 1B.

The buffer layer 162 may be formed by sputtering. When the buffer layer 162 (and the buffer pattern 162P) include a Ru film, the buffer layer 162 may be formed by performing a magnetron sputtering process that uses a Ru target as a target and an Ar gas as a sputter gas.

The light absorber layer 170 and the light absorber pattern 170P may include a material that absorbs EUV light and has a very low EUV light reflectance. Also, the light absorber layer 170 and the light absorber pattern 170P may include a material having a high chemical resistance. In some embodiments, the light absorber layer 170 and the light absorber pattern 170P may include a material that has a maximum light reflectance of about 5% at about a wavelength of about 13.5 nm when EUV light is irradiated onto the surfaces of the light absorber layer 170 and the light absorber pattern 170P.

The light absorber layer 170 and the light absorber pattern 170P may include a material that is formed mainly of Ta. In some embodiments, the light absorber layer 170 and the light absorber pattern 170P may include a Ta main component and at least one selected from the group of hafnium (Hf), Si, Zr, germanium (Ge), B, nitrogen (N), and hydrogen (H). For example, the light absorber layer 170 and the light absorber pattern 170P may include TaN, TaHf, TaHfN, TaBSi, TaBSiN, TaB, TaBN, TaSi, TaSiN, TaGe, TaGeN, TaZr, TaZrN, or any combination thereof. In some embodiments, the light absorber layer 170 and the light absorber pattern 170P may include a material having a Ta content of at least about 40 atom %.

In some embodiments, the light absorber layer 170 and the light absorber pattern 170P may further include about 0 atom % to 25 atom % oxygen (O).

When the buffer layer 162 includes Ru or a Ru compound, a chlorine (Cl)-based gas may be used as an etching gas to prevent the buffer layer 162 from being damaged when the light absorber layer 170 is dry-etched to form the light absorber pattern 170P constituting the pattern elements to be transferred onto the wafer in the pattern region during the manufacturing process of the photomask 100.

In some embodiments, a sputtering process may be used to perform the light absorber layer 170; however, the inventive concept is not limited thereto. In some embodiments, the light absorber layer 170 (including the light absorber pattern 170P) may have a thickness of about 30 nm to about 200 nm.

The low-reflection layer 172 (including the low-reflection pattern 172P) may provide a relatively low reflectance in a test light wavelength band, for example, an about 190 nm to about 260 nm wavelength band in the process of testing the pattern elements formed in the photomask 100, thereby making it possible to achieve a sufficient contrast. For example, the low-reflection layer 172 (and the low-reflection pattern 172P) may include TaBO, TaBNO, TaOH, or TaONH. The low-reflection layer 172 may be formed by sputtering; however, the inventive concept is not limited thereto.

In some embodiments, the low-reflection layer 172 and the low-reflection pattern 172P may each have a thickness of about 5 nm to about 25 nm.

In some embodiments, the energy receiving layer 180 covering the second surface 140B of the photomask substrate 140 may be physically deformed by absorbing energy (e.g., heat) that is locally provided from the outside thereof. A stress generated by the physical deformation of the energy receiving layer 180 may be transferred to the films formed on the first surface 140F of the photomask substrate 140, thus causing a thickness change of the films formed on the frontside of the photomask 100 or a profile deformation of the top surface that is exposed on the frontside of the photomask 100.

In some embodiments, in the pattern region and the non-pattern region of the photomask 100, the first surface 140F of the photomask substrate 140 may directly contact the multilayer reflection film 150, and the second surface 140B of the photomask substrate 140 may directly contact the energy receiving layer 180.

In some embodiments, the energy receiving layer 180 may include an amorphous material or a silicide. The energy receiving layer 180 may include a single layer including a material having a uniform composition, or may include a multilayer that is formed by stacking at least two types of materials alternately one or more times.

In some embodiments, the energy receiving layer 180 may include at least one material identical to the material included in the multilayer reflection film 150.

In some embodiments, the energy receiving layer 180 may have the same structure as the multilayer reflection film 150, such as that described herein for example. For example, the energy receiving layer 180 may include a Mo/Si periodic multilayer film, a Mo compound/Si compound periodic multilayer film, a Ru/Si periodic multilayer film, a Be/Mo period multilayer film, a Si/Nb periodic multilayer film, a Si/Mo/Ru periodic multilayer film, a Si/Mo/Ru/Mo periodic multilayer film, or a Si/Ru/Mo/Ru periodic multilayer film.

In some embodiments, the energy receiving layer 180 may include a silicide or an amorphous material including at least one first element selected from the group of Al, Si, and K. In other embodiments, the energy receiving layer 180 may include a single layer or a multilayer including at least one first element selected from the group of Al, Si, and K and at least one second element selected from the group of Nb, Mo, Ru, and palladium (Pd).

The energy receiving layer 180 may have a thickness of about 50 nm to about 500 nm, for example.

The energy receiving layer 180 may be formed by DC sputtering, RF sputtering, or ion beam sputtering, for example.

In some embodiments, the energy receiving layer 180 may be formed before the patterning of the light absorber layer 170 in the pattern region. For example, certain embodiments contemplate a photomask blank comprising a stack structure including the multilayer reflection film 150, an unpatterned light absorber layer 170 on the first surface 140F of the photomask substrate 140 and the energy receiving layer 180 on the second surface 140B of the photomask substrate 140. With the energy receiving layer 180 formed on the second surface 140B of the photomask substrate 140, a photolithography process may be used to pattern the light absorber layer 170 in the pattern region of the photomask blank to form the photomask 100 as illustrated in FIGS. 1A and 1B.

In other embodiments, the energy receiving layer 180 may be formed by depositing a material for the energy receiving layer 180 on the second surface 140B of the photomask substrate 140 after forming a photomask blank by forming a stack structure including the multilayer reflection film 150 and the light absorber layer 170 on the first surface 140F of the photomask substrate 140 and forming the light absorber pattern 170P by patterning the light absorber layer 170 in the pattern region of the photomask blank by using a photolithography process.

In other embodiments, the energy receiving layer 180 may be formed by depositing a material for the energy receiving layer 180 on the second surface 140B of the photomask substrate 140 before forming a stack structure including the multilayer reflection film 150 and the light absorber layer 170 on the first surface 140F of the photomask substrate 140. After the forming of the energy receiving layer 180, a stack structure including the multilayer reflection film 150 and the light absorber layer 170 may be formed on the first surface 140F of the photomask substrate 140 to form a photomask blank, and a photolithography process may be used to pattern the light absorber layer 170 in the pattern region of the photomask blank to form the photomask 100 as illustrated in FIGS. 1A and 1B.

The backside conductive film 190 covering the energy receiving layer 180 on the second surface 140B of the photomask substrate 140 may be used to fix the photomask 100 to an electrostatic chuck of an exposure apparatus in an exposure process.

The backside conductive film 190 may include a Cr-containing material or a Ta-containing material. For example, the backside conductive film 190 may include Cr or CrN. The backside conductive film 190 may have a thickness of about 20 nm to about 80 nm.

FIGS. 2A to 2H are partial cross-sectional views of exemplary energy receiving layers 182, C182, 184, C184, 186, and C186 that may be used as the energy receiving layer 180 illustrated in FIG. 1B.

Figure 2A:
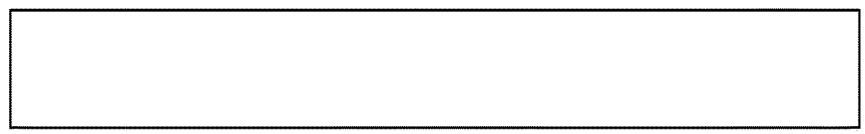
FIGS. 2A to 2H are partial cross-sectional views of exemplary energy receiving layers that may be used as an energy receiving layer illustrated in FIG. 1B.

Referring to FIG. 2A, the energy receiving layer 182 includes a single layer having a uniform composition. In some embodiments, the energy receiving layer 182 may include a silicide or at least one amorphous material selected from the group of Al, Si, and K.

Figure 2B:
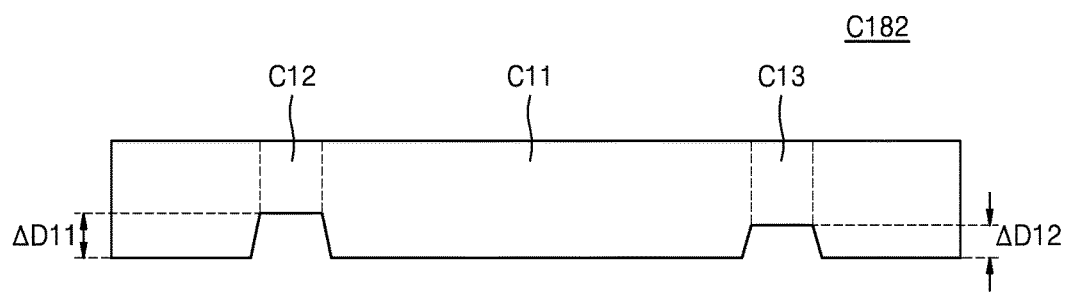

Referring to FIG. 2B, the energy receiving layer C182 has substantially the same structure as the energy receiving layer 182 illustrated in FIG. 2A. However, the energy receiving layer C182 includes a plurality of portions having different thicknesses. Thus, the energy receiving layer C182 may have indentations or a stepped surface. FIG. 2B illustrates a case where the portions having different thicknesses include a first portion C11, a second portion C12, and a third portion C13; however, the inventive concept is not limited thereto.

The second portion C12 has a thickness that is smaller by a first thickness $\Delta D11$ than a thickness of the first portion C11 in the thickness direction of the photomask substrate 140 (Z direction in FIGS. 1A and 1B). The third portion C13 has a thickness that is smaller by a second thickness $\Delta D12$ than the thickness of the first portion C11 in the thickness direction of the photomask substrate 140 (Z direction in FIGS. 1A and 1B). The first thickness $\Delta D11$ and the second thickness $\Delta D12$ may be equal to or different from each other.

Locations having the reduced thickness may take various forms. From a top down view (such as that shown in FIG. 10B), the locations having reduced thickness may be such as linear, curved or isolated geometrically shaped areas, such as circular, square, rectangular, for example. In some embodiments, the first portion C11 may include at least one amorphous element selected from the group of Al, Si, and K. At least a portion of the second portion C12 and the third portion C13 may include an element identical to the element of the first portion C11, but the element may be in a crystalline state.

Figure 2C:
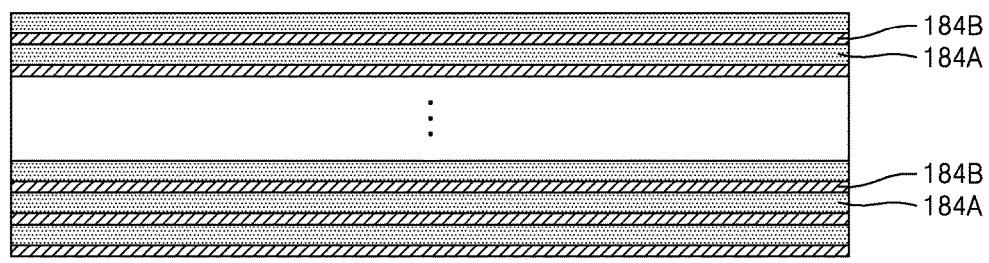

Referring to FIG. 2C, the energy receiving layer 184 includes a multilayer that is formed by stacking a first layer 184A and a second layer 184B, which include different materials, alternately a plurality of times. In some embodiments, the first layer 184A and the second layer 184B may be stacked alternately a plurality of times, such as about 20 to 60 times.

At least one of the first layer 184A and the second layer 184B may include an amorphous material. For example, at least one of the first layer 184A and the second layer 184B may include at least one first element selected from the group of Al, Si, and K. The first element may be in an amorphous state. The other of the first layer 184A and the second layer 184B may include at least an element selected from the group of Nb, Mo, Ru, and Pd.

Each first layer 184A may have a first thickness and each second layer 184 my have a second thickness. The first thickness may be substantially the same thickness as the second thickness. Alternatively, thicknesses of each first layer 184A may vary and/or thicknesses of each second layer 184B may vary. In some embodiments, the energy receiving layer 184 may have the same structure as the multilayer reflection film 150 illustrated in FIG. 1B.

Figure 2D:
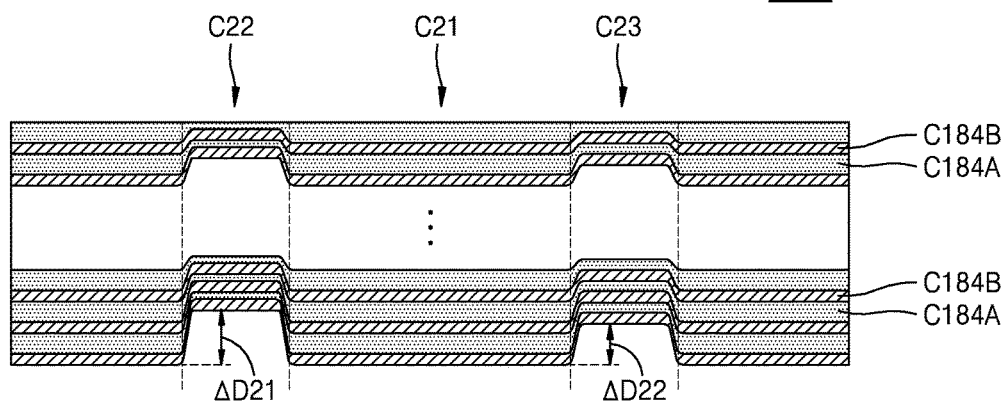

Referring to FIG. 2D, like the energy receiving layer 184 illustrated in FIG. 2C, the energy receiving layer C184 includes a multilayer structure that is formed by stacking a first layer C184A and a second layer C184B, which include different materials, alternately a plurality of times. The first layer C184A and the second layer C184B are substantially identical to the first layer 184A and the second layer 184B described with reference to FIG. 2C. However, the energy receiving layer C184 includes a plurality of portions having different thicknesses. Thus, the energy receiving layer C184 may have a stepped surface or a surface with indentations. FIG. 2D illustrates a case where the portions having different thicknesses include a first portion C21, a second portion C22, and a third portion C23; however, in other examples only one portion may have a different thickness than the remaining of the energy receiving layer C184 or more than two discrete, separated portions of the energy receiving portion may have different thickness(es) than the remainder of the energy receiving portion.

The second portion C22 has a thickness that is smaller by a first thickness $\Delta D21$ than a thickness of the first portion C21 in the thickness direction of the photomask substrate 140 (Z direction in FIGS. 1A and 1B). The third portion C23 has a thickness that is smaller by a second thickness $\Delta D22$ than the thickness of the first portion C21 in the thickness direction of the photomask substrate 140 (Z direction in FIGS. 1A and 1B). The first thickness $\Delta D21$ and the second thickness $\Delta D22$ may be equal to or different from each other.

In some embodiments, in the first layer C184A, the thicknesses of regions included in the second portion C22 and the third portion C23 may be smaller than the thickness of a region included in the first portion C21. In the first portion C21, the first layer C184A may include at least one amorphous element selected from the group of Al, Si, and K. At least a portion of the first layer C184A in the second portion C22 and in the third portion C23 may include an element, compound or material identical to the element, compound or material of the first layer C184A in the first portion C21, but the element may be in a crystalline state. The portion of the first layer C184A in the second portion C22 and in the third portion C23 that is in a crystalline state may only be a part of the first layer C184A in the second portion C22 and in the third portion C23. For example, more than 50% or more than 75% of the material of the first layer C184A either in the second portion C22 and/or in the third portion C23 may be crystalline and the remaining material there may be amorphous.

Figure 2E:
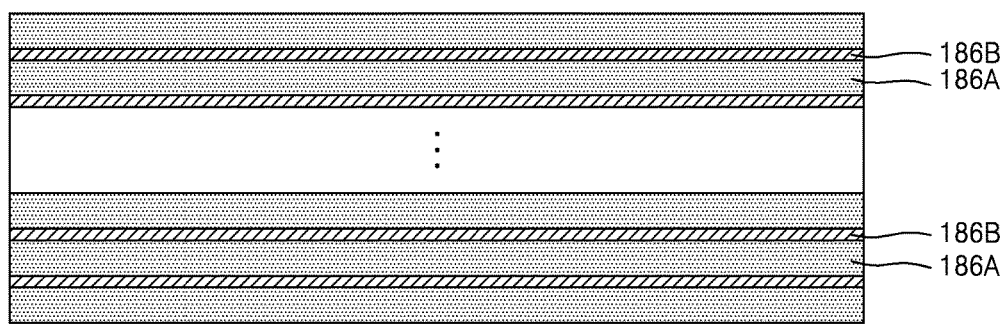

Referring to FIG. 2E, like the energy receiving layer 184 illustrated in FIG. 2C, the energy receiving layer 186 includes a multilayer that is formed by alternately stacking a first layer 186A and a second layer 186B, a plurality of times. Like the energy receiving layer 184 of FIG. 2C, the first layers 186A may be formed of a material (such as a compound, composition or element) different than the second layer 186B, however, the first layers 186A may be thicker than the second layers 186B.

The first layer 186A may include an amorphous material. For example, the first layer 186A may include at least one first element selected from the group of Al, Si, and K. The second layer 186B thinner than the first layer 186A may include an element selected from the group of Nb, Mo, Ru, and Pd.

In the energy receiving layer 186, the first layer 186A and the second layer 186B may be stacked alternately a plurality of times, such as 20 to 60 times.

Figure 2F:
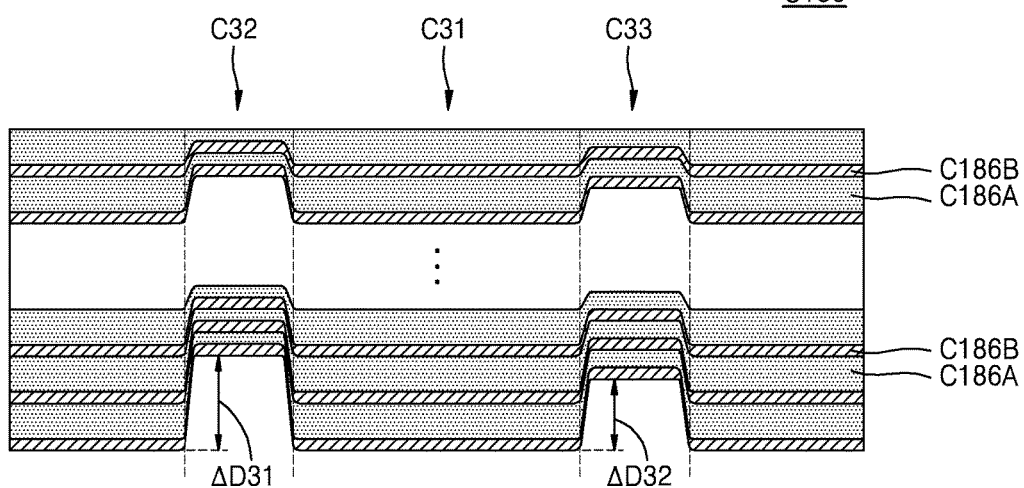

Referring to FIG. 2F, like the energy receiving layer 186 illustrated in FIG. 2E, the energy receiving layer C186 includes a multilayer that is formed by alternately stacking a first layer C186A and a second layer C186B, which include different materials, a plurality of times. The first layer C186A and the second layer C186B are substantially identical to the first layer 186A and the second layer 186B described with reference to FIG. 2E.

However, the energy receiving layer C186 includes a plurality of portions having different thicknesses. Thus, the energy receiving layer C186 may have indentations or a stepped surface. FIG. 2F illustrates two indentations at portion C32 and C33. Specifically the energy receiving layer C186 includes three portions having different thicknesses include a first portion C31, a second portion C32, and a third portion C33; however, the inventive concept is not limited thereto and may include more or less portions with different thicknesses.

The second portion C32 has a thickness that is smaller by a first thickness ΔD31 than a thickness of the first portion C31 in the thickness direction of the photomask substrate 140 (Z direction in FIGS. 1A and 1B). The third portion C33 has a thickness that is smaller by a second thickness ΔD32 than the thickness of the first portion C31 in the thickness direction of the photomask substrate 140 (Z direction in FIGS. 1A and 1B). The first thickness ΔD31 and the second thickness ΔD32 may be equal to or different from each other.

In some embodiments, in the first layer C186A, the thicknesses of regions included in the second portion C32 and the third portion C33 may be smaller than the thickness of a region included in the first portion C31. In the first portion C31, the first layer C186A may include at least one amorphous material, such as an element selected from the group of Al, Si, and K. At least a portion of the first layer C186A in the second portion C32 and the third portion C33 may include a material identical to the material of the first layer C186A in the first portion C31, but the material may be in a crystalline state. Since the thickness of the first layer C186A illustrated in FIG. 2F is greater than the thickness of the first layer C184A illustrated in FIG. 2D, a difference between the thickness of the first portion C31 of an amorphous state in the first layer C186A and the thickness of the second portion C32 and the third portion C33 of a crystalline state in the first layer C186A may be greater than a difference between the thickness of the first potion C21 of an amorphous state in the first layer C184A and the thickness of the second portion C22 and the third portion C23 of a crystalline state in the first layer C184A.

Figure 2G:
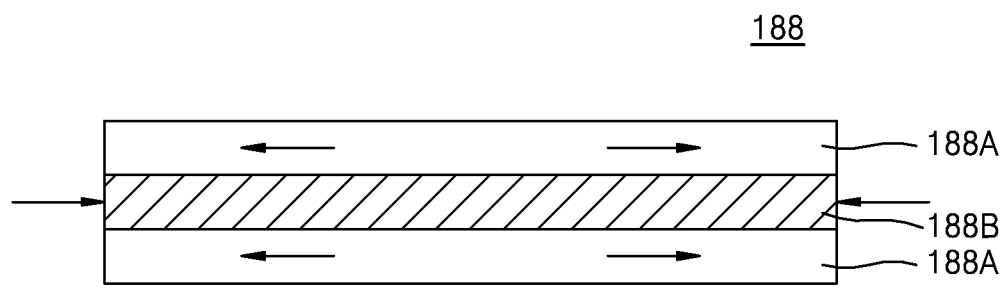

Referring to FIG. 2G, the energy receiving layer 184 comprises two first layers 188A and a second layer 188B interposed between the two first layers 188A. The opposite surfaces of second layer 188B are joined to the adjacent corresponding surfaces of the upper and lower first layers 188A. The opposite surfaces of the second layer 188B may be joined to corresponding surfaces of the upper and lower first layers 188A by adhering the adjacent with an adhesive (not shown), merged together directly contact each other with a heat treatment process or formed directly on each other (e.g., by a deposition process). The second layer 188B is formed with a compressive stress (denoted by the two inwardly pointing arrows) while the first layers 188A are formed with a tensile stress (denoted by the two outwardly point arrows). The compressive stress of the second layer 188B may be applied by the first layers 188A and the tensile stress of the first layers may be applied by the second layer 188B.

Figure 2H:
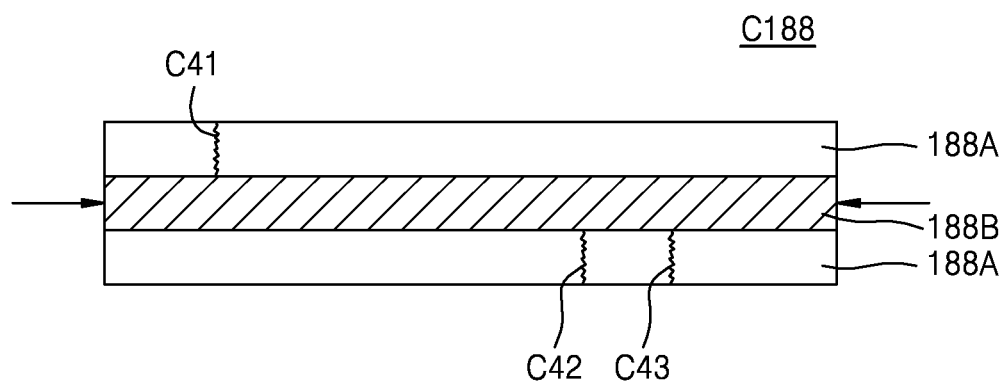

Referring to FIG. 2H, portions of the first layers 188A may be cut. The cuts may be obtained by applying energy to the first layers 188A, such as with a laser. The focal point of the laser may determine the depth and thus selectively cut one of the first layers 188A. As the compressive stress of the second layer 188B is applied by first layers 188A, cutting a first layer 188A may partially relieve the compressive stress, giving the energy receiving layer a tendency to bend at a location corresponding to the cut (outwardly with respect to the outer surface of the corresponding cut first layer 188A).

The tensile and compressive stresses may be obtained in the first and second layers 188A and 188B by joining the first and second layers 188A and 188B at temperatures other than the temperature at which the photomask is used and using materials having different coefficients of thermal expansion (CTEs) for the first and second layers 188A and 188B. For example, the first layers 188A may be formed of a material with a relatively higher CTE than the second layer 188B and the materials may be joined together or formed on one another at a high temperature. When the temperature is reduced, such as to the normal temperature of use of the photomask (e.g., about room temperature such as less than 35 or 40 degrees C., or less than 100 degrees C.), the first layers 188A may attempt to contract at a higher rate than the second layer 188B due to their higher CTE. The bonding between the layers prevents a full contraction of the first layers 188A (as compared to the natural state of the first layer 188A—e.g., unconnected to a second layer 188B) and exert a compressive stress on the second layer 188B. Similarly, the tendency of the second layer 188B not to shrink as much as the first layers 188A upon cooling will provide a tensile stress on the first layers 188A. Any suitable materials maybe selected for the first and second layers 188A and 188B. For example, the first layers 188A may be polyimide or an exoxy resin while the second layer 188B may be silicon. In one alternative, the outer first layer 188A may be a conductive film and act as the backside conductor 190 eliminating the need for an extra layer. This also allows at least one of the first layers 188A to be the outermost layer, avoiding counteraction of forces that may have otherwise been applied by the backside conductor upon cutting the outermost first layer 188A.

Other structures may be used as the energy receiving layer 180. For example, a piezoelectric material may be selectively activated to provide additional stresses at the location of the activation. The energy receiving layer 180 may comprise a piezoelectric material layer interposed between a common plate electrode (which also act as the backside conductive film) and an active layer comprising an array of individually activated electrodes (such as by an SRAM or DRAM array, with each memory cell of the SRAM driving a corresponding electrode, or each memory cell of the DRAM array using one of the corresponding electrodes as a charge storage capacitor). The structure implementing a DRAM array may the same as a liquid crystal display panel except the liquid crystal layer may be replaced by a piezoelectric layer.

FIG. 3 is a flowchart of a method of correcting errors of a photomask, according to embodiments of the inventive concept. For convenience of description, the photomask error correcting method illustrated in FIG. 3 is described as a method of correcting an error of the photomask 100 illustrated in FIGS. 1A and 1B, however the method may be applied to other photomasks and other structures benefiting from adjusting a surface to a desired shape.

Referring to FIGS. 1A, 1B, and 3, in step S12, a photomask 100 is prepared.

The photomask 100 may include an energy receiving layer, such as any one of the energy receiving layers 180, 182, 184, 186 and 188 described with reference to FIGS. 1A, 1B, 2A, 2C, 2E and 2G.

The photomask 100 may be in a state before being exposed or being fixed to an electrostatic chuck of an exposure apparatus. Alternatively, the photomask 100 may be in a state after being exposed on the wafer by light reflected from the frontside of the photomask 100 while being fixed to an electrostatic chuck of an exposure apparatus.

In step S14, an error of the photomask 100 is detected.

In some embodiments, in order to detect an error of the photomask 100, various characteristics in the frontside or the backside of the photomask 100 may be measured.

In some embodiments, the error of the photomask 100 detected in step S14 may be a flatness error of the photomask 100.

In other embodiments, the error of the photomask 100 detected in step S14 may be a thickness variation of the photomask 100.

In other embodiments, the error of the photomask 100 detected in step S14 may be a critical dimension uniformity (CDU) error of the photomask 100, or a CDU of patterns that are formed on the wafer through an exposure process performed by using light reflected from the photomask 100.

In other embodiments, the error of the photomask 100 detected in step S14 may be an imaging error that occurs as a result of an exposure process performed by using the photomask 100, such as an error value reflecting a deviation of a light pattern from a target location, the light pattern being obtained by irradiating the photomask 100.

In other embodiments, the error of the photomask 100 detected in step S14 may be a registration error of the photomask 100.

In other embodiments, the error of the photomask 100 detected in step S14 may be a difference between a desired or predicted position and an actual position of the main pattern element 112 or the auxiliary pattern element 122 (see FIG. 1A) in the photomask 100.

In other embodiments, the error of the photomask 100 detected in step S14 may be a difference between a desired or predicted position and an actual position of the pattern element formed on a wafer or other surface, the pattern element being formed by light reflected from the photomask 100.

Figure 4:
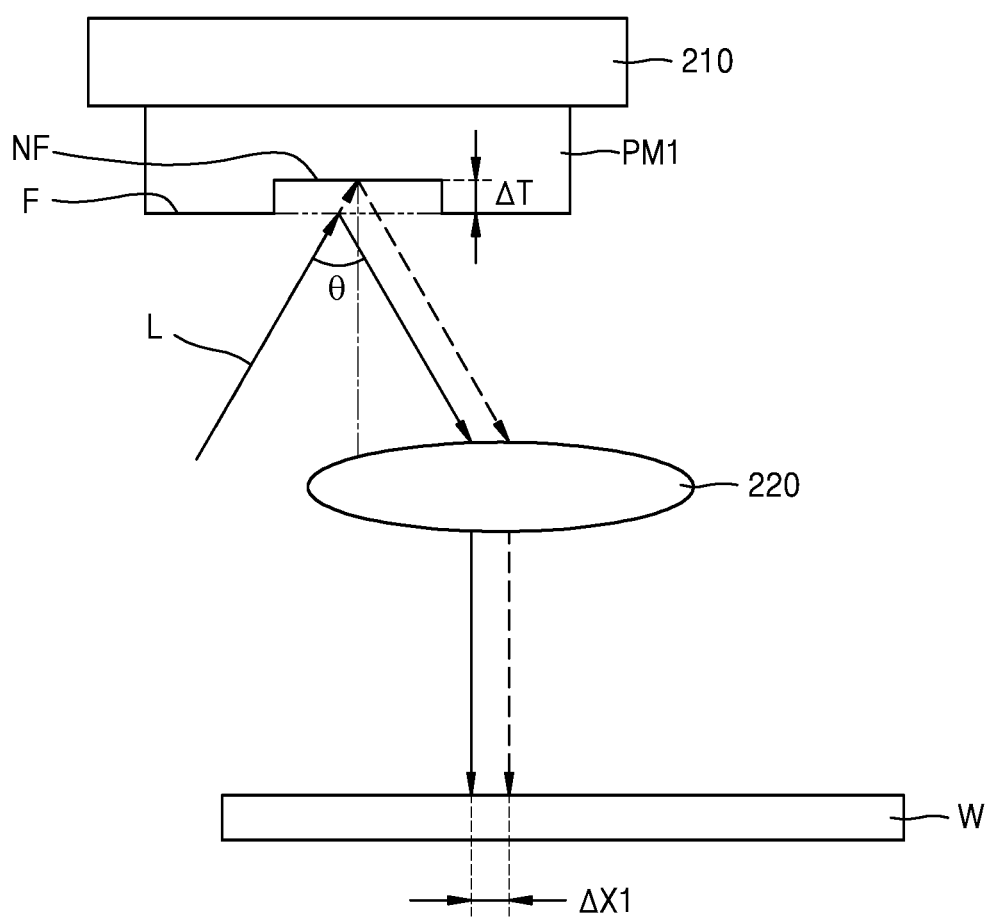
FIG. 4 is a diagram illustrating an image shift that occurs due to contactless three-dimensional measurability (non-telecentricity) of an extreme ultraviolet (EUV) lithography system.

FIG. 4 is a diagram illustrating an image shift that occurs due to contactless three-dimensional measurability (non-telecentricity) of an EUV lithography system 200.

Referring to FIG. 4, a photomask PM1 fixed to an electrostatic chuck 210 of the EUV lithography system 200 may include a flat portion F on a frontside thereof that is substantially flat, and is non-flat portion NF that is at least partially non-flat with respect to the flat portion F. The non-flat portion NF may be, for example, an uneven portion that is displaced in a thickness direction of the photomask PM1. The non-flat portion NF is shown as an indentation with respect to the flat portion F but it may be a raised element, such as a bump, with respect to the flat portion F instead. The non-flat portion NF is represented as stepped indentation, but may take other forms, such as a gradual dishing with respect to the flat portion F. A variation degree of the flat portion F and the non-flat portion NF may be represented by a height difference ΔT in the thickness direction of the photomask PM1. Due to the height difference ΔT, the position of irradiation of exposure light L on the photomask PM1 is misaligned in a horizontal direction, and thus an overlay error occurs since an image shift occurs in an imaging surface on a wafer W.

When an incidence angle of the exposure light L is θ and a reduction ratio of a projection optics exposure system 220 is 1/M, an image shift amount ΔX1 on the wafer W may be expressed as Equation 1.

$$\Delta X1 = (1/M) \times \Delta T \times \tan\theta \qquad \text{Equation 1}$$

In Equation 1, ΔX1 is an image shift amount in a direction identical to a scan direction in exposure.

For example, when the height difference ΔT is about 50 nm, the reduction ratio 1/M of the projection optics exposure system 220 is about ¼, and the incidence angle θ of the exposure light L is about 6°, the image shift amount ΔX1 on the wafer W is about 1.3 nm.

An image shift occurring due to the above error may cause position accuracy degradation and/or may cause undesired differences in features due to their different locations on the wafer (e.g., due to undesired differences in exposure from different portions of the photomask). By measuring an image shift amount (of a deviation of the location of a projected feature from the mask from an expected location of the projected feature from the mask), the height difference ΔT at a location of the mask may be calculated. The measured image shift amount may be ΔX1 as shown in FIG. 4, or may be a measurement obtained other than at wafer level, such as a measurement taken without the use of projection optics exposure system 220 or taken with a different system.

Figure 5:
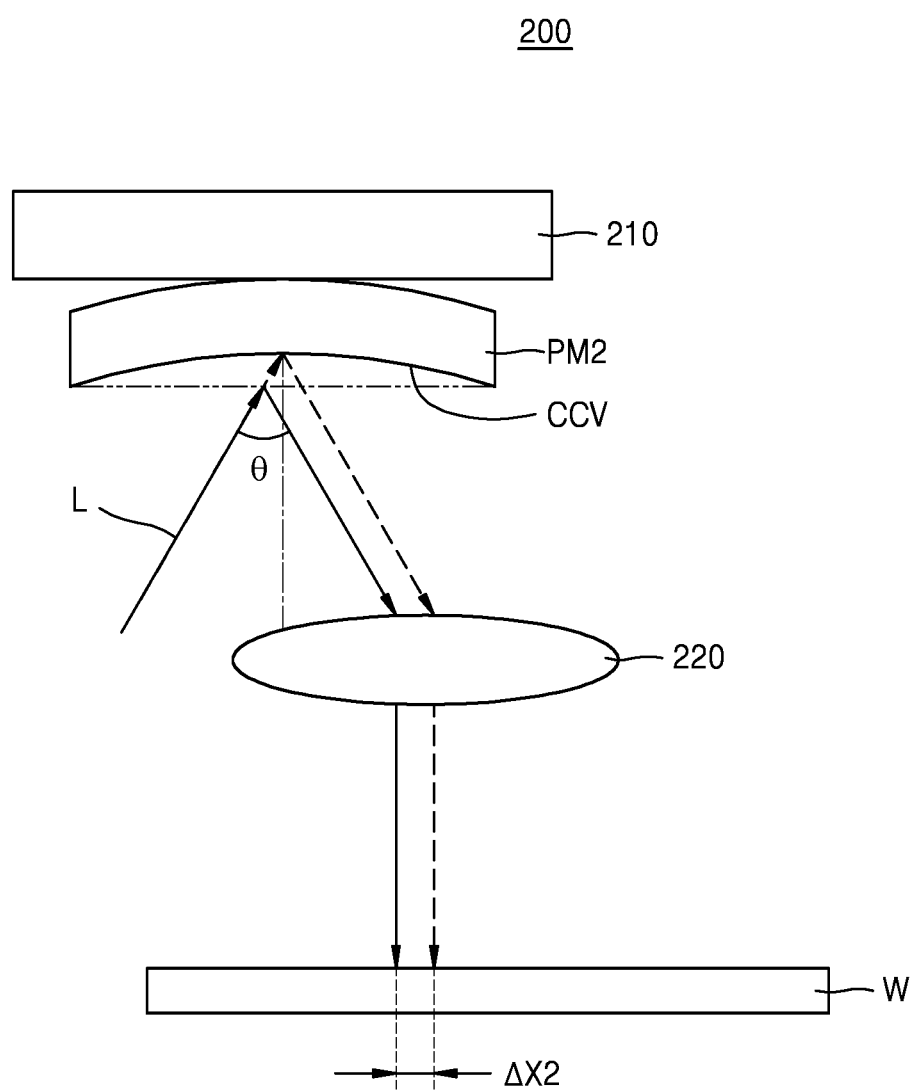
FIG. 5 is a diagram illustrating an image shift that occurs when a flatness error occurs in a photomask due to an elastic deformation.

FIG. 5 is a diagram illustrating an image shift that occurs when a flatness error occurs in a photomask PM2 due to an elastic deformation.

Referring to FIG. 5, when a flatness error occurs in a photomask PM2 fixed to the electrostatic chuck 210 of the EUV lithography system 200 and thus a concave surface CCV is formed on a frontside that is an exposure light incidence surface of the photomask PM2, a pattern position on the photomask PM2 is misaligned and thus an overlay error occurs since an image shift of a predetermined amount $\Delta X2$ occurs on an imaging surface on the wafer W in a direction identical to a scan direction in exposure.

FIG. 5 illustrates a case where the concave surface CCV is formed on the frontside of the photomask PM2, however the flatness error may result from a convex surface. When a convex surface is formed on the frontside of the photomask PM2, an overlay error may similarly occur since an image shift occurs on the imaging surface on the wafer W. It should also be emphasized that a combination of one or more the convex, concave and stepped, depressed and raised flatness errors discussed herein may occur in a single photomask and be corrected as described herein.

Figure 6:
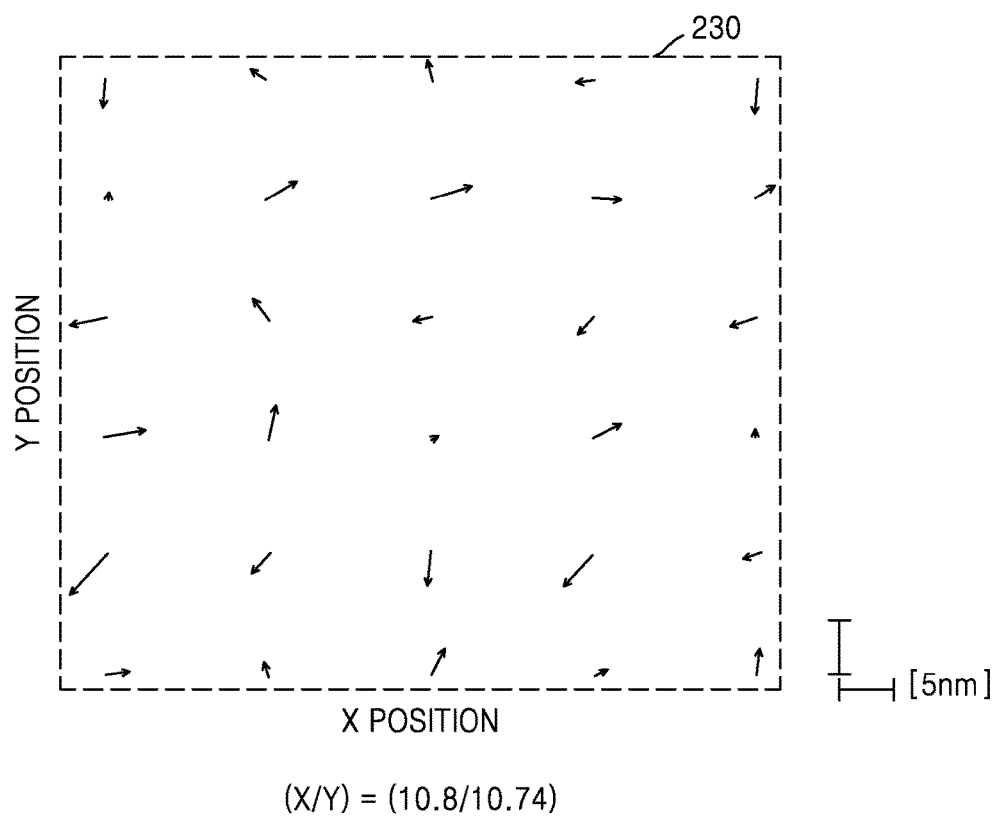
FIG. 6 is a two-dimensional map illustrating results of measuring registration errors in pattern elements formed in a photomask to be error-corrected.

FIG. 6 is a two-dimensional registration map 230 illustrating results of measuring registration errors in pattern elements formed in a photomask to be error-corrected.

A registration error of a photomask may occur due to a flatness error of the photomask or may occur when the photomask is clamped to an electrostatic chuck of an EUV lithography system. A registration error may occur when some of pattern elements on a photomask are not accurately located at predetermined desired positions (e.g., deviating from a designed position due to a deviations during manufacturing). When a registration error occurs in pattern elements on a photomask, shapes of patterns transferred from the pattern elements onto a photoresist film on a wafer may not be identical to designed shapes or the patterns may not be transferred to accurate positions of the photoresist film.

A distribution of the registration error of the photomask may be represented by a two-dimensional map 230 of arrows as illustrated in FIG. 6. In the two-dimensional map 230, the direction of each arrow represents a shift direction of each pattern element or a reflection of the pattern element as reflected from the photomask with respect to a desired or target position (X: 0.00, Y: 0.00) thereof, and the length of each arrow represents a shift amount.

In some embodiments, various equipment may be used to detect an error of the photomask in step S14 of FIG. 3.

In some embodiments, for example, Tropel UltraFlat (manufactured by Corning Tropel) may be used to detect a flatness error of the photomask; however, the inventive concept is not limited thereto. For example, an interferometer manufactured by Zygo or Tropel may be used.

In an exemplary method of measuring a thickness distribution of the photomask, when the photomask includes a material (e.g., silica glass or $TiO_2$-$SiO_2$ glass) having high light transmittance in a visible light region at a wavelength of about 300 nm to about 800 nm, an interferometer using a light source of visible light with a wavelength of about 300 nm to about 800 nm is used to measure an overall thickness distribution of the photomask based on an optical path difference of beams reflected from a frontside surface and a backside surface thereof, and the overall thickness distribution may be obtained from a difference between a maximum value and a minimum value of a remainder that is obtained by subtracting a tilting component from an obtained thickness distribution. Examples of the interferometer for measuring a thickness distribution include an Corning Tropel interferometer, a Tropel UltraFlat interferometer, a Zygo interferometer (Verifire or MarkIV), and a Fujinon interferometer (G310S).

In another exemplary method of measuring a thickness distribution of the photomask, a laser interference type flatness measuring device, a laser displacement gauge, an ultrasonic displacement gauge, or a contact type displacement gauge may be used to measure a shape of a frontside surface of the photomask, for example, a frontside surface profile, and a thickness distribution of the photomask may be calculated from measured data.

In another exemplary method, as means for measuring an error of the photomask, an atomic force microscope (AFM), a scanning tunneling microscope (STM), a stylus profilometer, or an interferometer may be used to measure a frontside surface shape of the photomask.

Referring back to FIG. 3, in step S16, a local correction position in the frontside surface of the photomask may be determined based on the error detected in step S14.

In some embodiments, the local correction position in the frontside surface of the photomask may be selected in a portion of the frontside surface of the photomask that is recessed more than other portions.

Figure 7A:
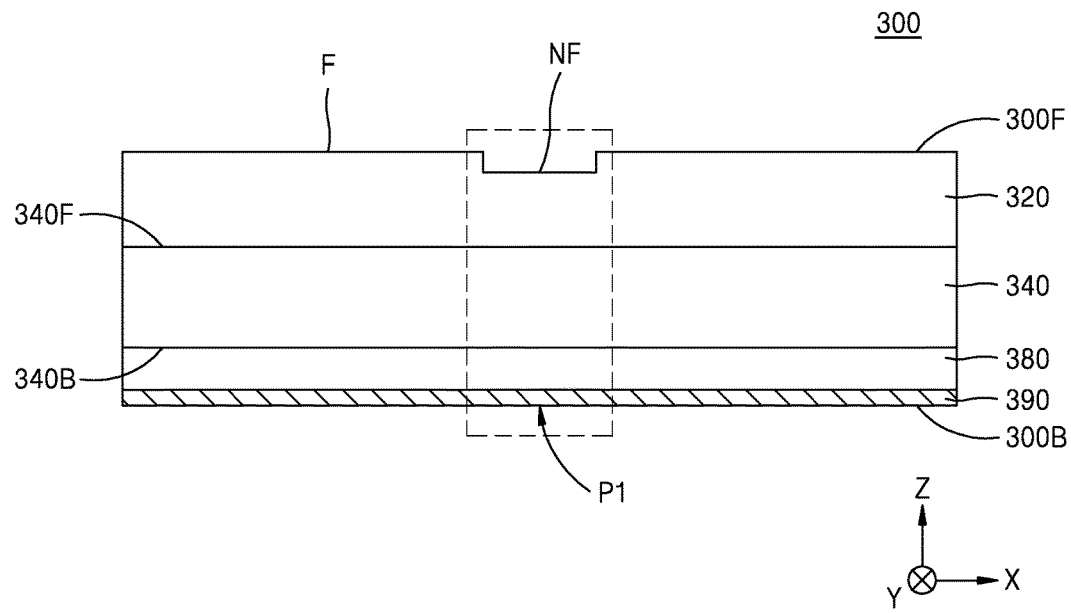
FIG. 7A is a schematic cross-sectional view of a photomask to be error-corrected, according to an embodiment of the inventive concept.

FIG. 7A is a schematic cross-sectional view of a photomask 300 to be error-corrected, according to an embodiment of the inventive concept.

As illustrated in FIG. 7A, the photomask 300 has a frontside surface 300F, on which exposure light is incident in an exposure process, and a backside surface 300B that is opposite to the frontside surface 300F.

The photomask 300 includes a photomask substrate 340 that has a first surface 340F and a second surface 340B.

A stack structure 320 for selectively reflecting exposure light incident on the frontside surface 300F of the photomask 300 in an exposure process is formed on the first surface 340F of the photomask substrate 340. The stack structure 320 may have a structure that is formed by sequentially stacking the multilayer reflection film 150, the capping layer 160, the buffer layer 162 or the buffer pattern 162P, the light absorber layer 170 or the light absorber pattern 170P, and the low-reflection layer 172 or the low-reflection pattern 172P described with reference to FIGS. 1A and 1B.

An energy receiving layer 380 and a backside conductive film 390 are sequentially formed on the second surface 340B of the photomask substrate 340. The photomask substrate 340, the energy receiving layer 380, and the backside conductive film 390 may have substantially the same structures as the photomask substrate 140, the energy receiving layer 180, and the backside conductive film 190 described with reference to FIGS. 1A and 1B. As noted previously, the energy receiving layer 180 of FIGS. 1A and 1B may be any of those described herein, such as those described with respect to FIGS. 2A-2H.

Since the frontside surface 300F of the photomask 300 includes a flat portion F that is substantially flat, and a non-flat portion NF that is at least partially non-flat with respect to the flat portion F, a thickness variation occurs in the photomask 300. The non-flat portion NF has a surface that is recessed from the flat portion F. The non-flat portion NF may correspond to a reflection region of the photomask 300, or may correspond to a light absorbing region of the photomask 300.

In order to correct a thickness variation of the photomask 300 illustrated in FIG. 7A, the non-flat portion NF of the frontside surface 300F of the photomask 300 may be selected as a local correction position.

Figure 8A:
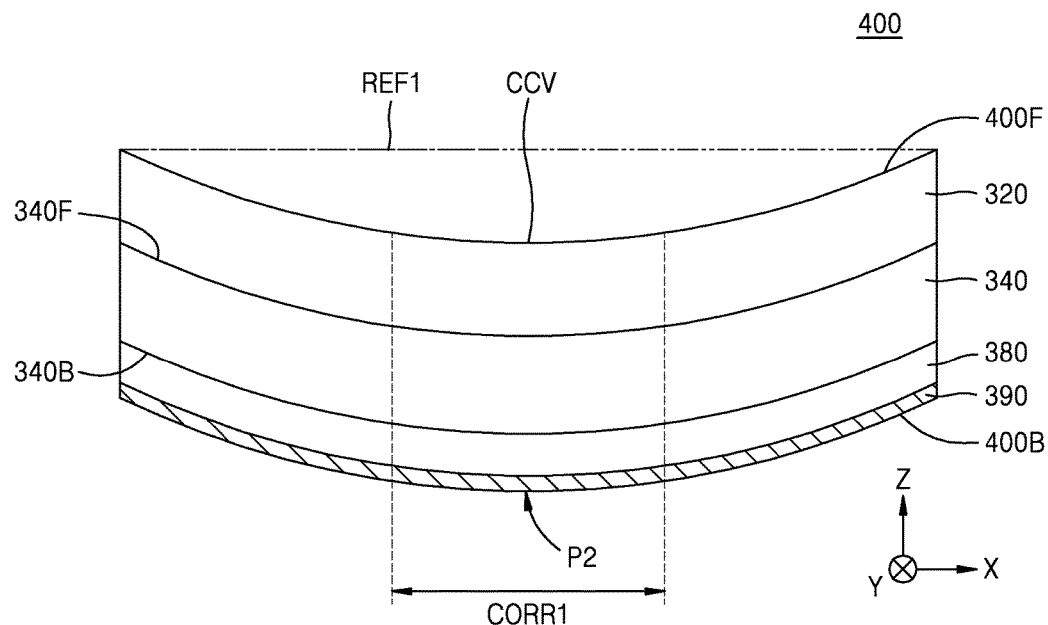
FIG. 8A is a schematic cross-sectional view of a photomask to be error-corrected, according to another embodiment of the inventive concept.

FIG. 8A is a schematic cross-sectional view of a photomask 400 to be error-corrected, according to another embodiment of the inventive concept. In FIGS. 8A and 7A, like reference numerals denote like elements and redundant descriptions thereof will be omitted herein.

As illustrated in FIG. 8A, the photomask 400 has a frontside surface 400F, on which exposure light is incident in an exposure process, and a backside surface 400B that is opposite to the frontside surface 400F. The photomask 400 has a flatness error since a concave surface CCV is formed on the frontside surface 400F.

In order to correct a flatness error of the photomask 400 illustrated in FIG. 8A, a virtual horizontal surface having the highest level in the concave surface CCV on the frontside surface 400F of the photomask 400 is set as a reference surface REF1, a correction range CORR1 is selected from a portion that is relatively distant from the reference surface REF1, and the correction range CORR1 may be determined as a local correction position.

Figure 9A:
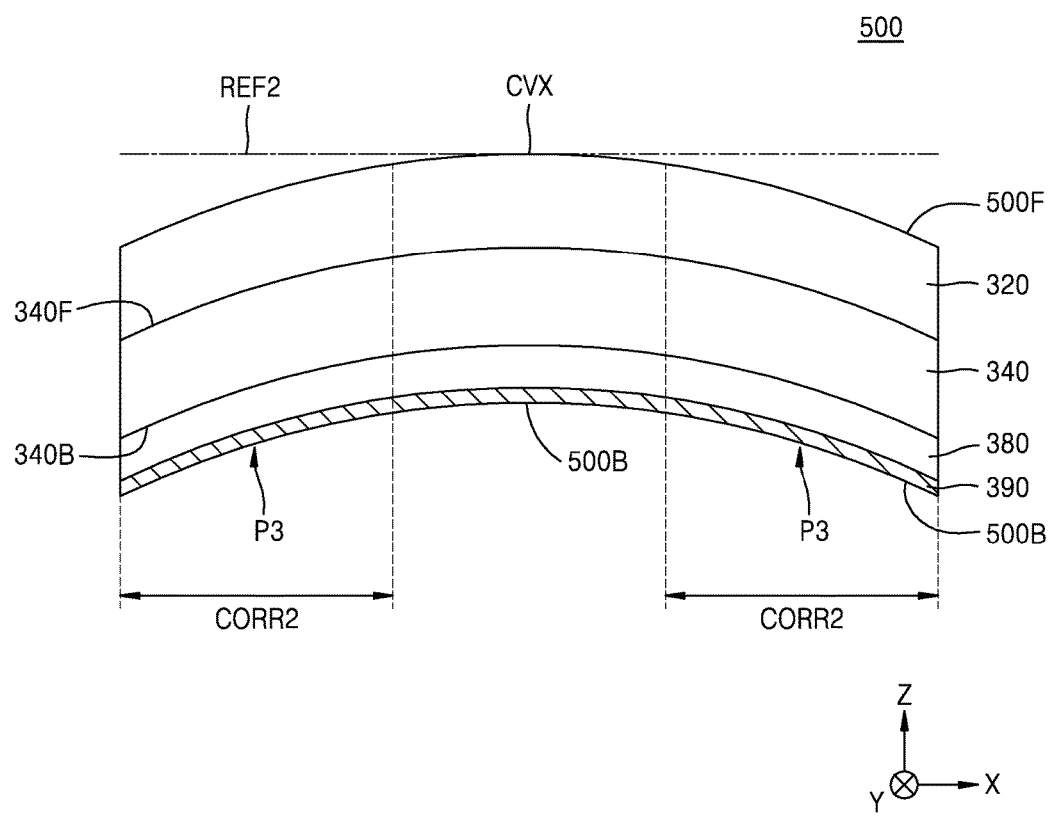
FIG. 9A is a schematic cross-sectional view of a photomask to be error-corrected, according to another embodiment of the inventive concept.

FIG. 9A is a schematic cross-sectional view of a photomask 500 to be error-corrected, according to another embodiment of the inventive concept. In FIGS. 9A and 7A, like reference numerals denote like elements and redundant descriptions thereof will be omitted herein.

As illustrated in FIG. 9A, the photomask 500 has a frontside surface 500F, on which exposure light is incident in an exposure process, and a backside surface 500B that is opposite to the frontside surface 500F. The photomask 500 has a flatness error since a convex surface CVX is formed on the frontside surface 500F.

In order to correct a flatness error of the photomask 500 illustrated in FIG. 9A, a virtual horizontal surface having the highest level in the convex surface CVX on the frontside surface 500F of the photomask 500 is set as a reference surface REF2, a correction range CORR2 is selected from a portion that is relatively distant from the reference surface REF2, and the correction range CORR2 may be determined as a local correction position.

Referring back to FIG. 3, in step S18, an error of the photomask is corrected by applying an energy beam to a backside surface region aligned with the local correction position determined in step S16 in the thickness direction of the photomask.

In the case of the photomask 300 illustrated in FIG. 7A, a backside surface region P1 aligned with the non-flat portion NF set as the local correction position in the thickness direction (Z direction in FIG. 7A) of the photomask 300 may be determined as the energy beam applying position.

In the case of the photomask 400 illustrated in FIG. 8A, a backside surface region P2 aligned with the local correction position CORR1 of the concave surface CCV in the thickness direction (Z direction in FIG. 8A) of the photomask 400 may be determined as the energy beam applying position.

In the case of the photomask 500 illustrated in FIG. 9A, a backside surface region P3 aligned with the local correction position CORR2 of the convex surface CVX in the thickness direction (Z direction in FIG. 9A) of the photomask 500 may be determined as the energy beam applying position.

The energy beam may be at least one of an electron beam, a focused ion beam, a laser beam, and an electromagnetic beam, but is not limited thereto.

Figure 7B:
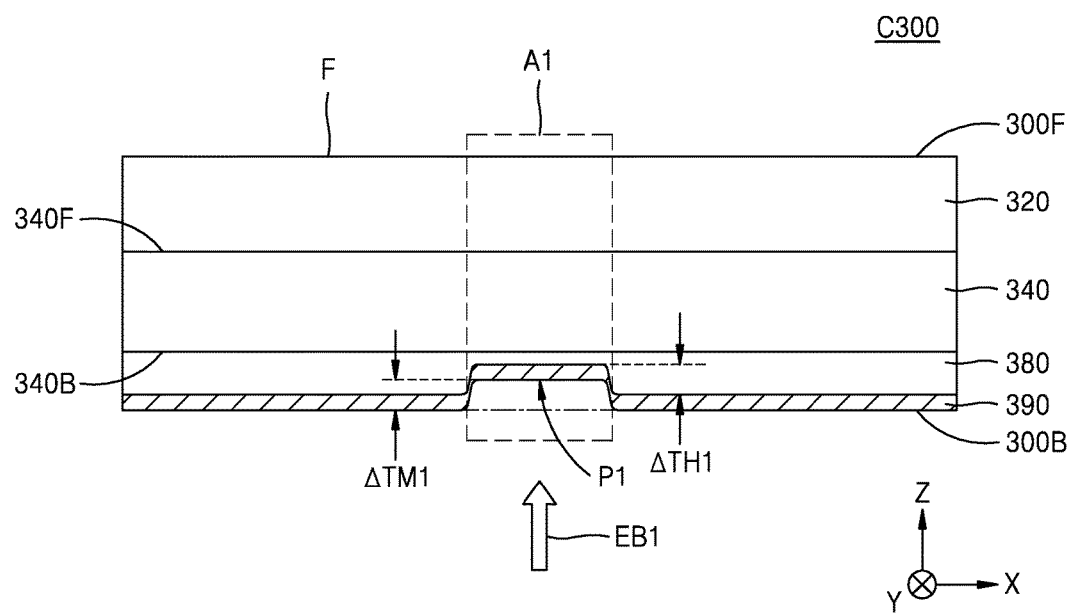
FIG. 7B is a cross-sectional view illustrating an exemplary method of correcting a thickness of a non-flat portion of the photomask illustrated in FIG. 7A, which is set as a local correction position, by a photomask error correcting method according to an embodiment of the inventive concept.

FIG. 7B is a cross-sectional view illustrating an exemplary method of correcting a thickness of a non-flat portion NF of the photomask 300 illustrated in FIG. 7A, which is set as a local correction position, by step S18 of FIG. 3.

Referring to FIGS. 7A and 7B, an energy beam EB1 is locally applied to the backside surface region P1 aligned with the non-flat portion NF determined as the local correction position of the photomask 300 in the thickness direction (Z direction in FIGS. 7A and 7B) of the photomask 300.

The energy beam EB1 may include an electron beam, a focused ion beam, a laser beam, or an electromagnetic beam.

As illustrated in FIG. 7B, when the energy beam EB1 is locally applied to the backside surface region P1, a portion of the energy receiving layer 380 corresponding to the backside surface region P1 is physically deformed by absorbing energy received from the outside thereof. The physical deformation of the energy receiving layer 380 may cause various stresses in the photomask 300. The generated stress is transferred from the backside surface region P1 to the local correction position of the frontside surface 300F in the thickness direction of the photomask 300. Therefore, the height of the top surface increases the local correction position in the frontside surface 300F of the photomask 300, and thus the top surface of the non-flat portion NF after the applying of the energy beam EB1 may become closer to a level of or have substantially the same level as the top surface of the flat portion F. As a result, a corrected photomask C300 with a thickness variation reduced or corrected may be obtained as illustrated in FIG. 7B. FIG. 7B illustrates the resulting top surface of the wafer to be perfectly flat after correction for ease of description, but correcting to reduce an overall flatness deviation may be sufficient. Further, it may be desirable to correct a flatness deviation of a photomask so that a shift direction of reflected features are more aligned with a single direction (e.g., so that a modified registration map, such as that shown in FIG. 6 has more arrows aligned or an increase in the vector components of such arrows with a same direction). The remaining misalignment of the photomask (as reflected by the arrows of the corresponding registration map) allows for easier subsequent correction of the reflected pattern by a scanner used to irradiate the mask during manufacturing. A physical deformation may occur in a vertical region A1 of the corrected photomask C300, which corresponds to the backside surface region P1 to which the energy beam EB1 is applied, in the thickness direction of the photomask 300. Thus, a portion physically deformed by the energy beam EB1 may be included in the vertical region A1.

In some embodiments, due to the physical deformation of the energy receiving layer 380 in the vertical region A1, the thickness of a portion of the energy receiving layer 380 corresponding to the backside surface region P1 may be reduced. In other embodiments, when the energy receiving layer 380 includes an amorphous material, a portion included in the vertical region A1 among the amorphous material included in the energy receiving layer 380 may be crystallized.

In some embodiments, an increase rate of the height of the top surface of the non-flat portion NF may be controlled so that the height of the top surface of the non-flat portion NF set as the local correction position is substantially equal to the height of the top surface of the flat portion F therearound. To this end, a thickness change amount $\Delta TH1$ of a portion of the energy receiving layer 380 corresponding to the backside surface region P1, or a thickness reduction amount $\Delta TM1$ of a portion corresponding to the backside surface region P1 on the backside surface 300B of the photomask 300 may be determined. In some embodiments, the height increase amount of the top surface of the portion corresponding to the local correction position on the frontside surface 300F may increase as the thickness change amount $\Delta TH1$ of the energy receiving layer 380 or the thickness reduction amount $\Delta TM1$ on the backside surface 300B of the photomask 300 increases. Thus, the thickness change amount $\Delta TH1$ of the energy receiving layer 380 or the thickness reduction amount ΔTM1 on the backside surface 300B of the photomask 300 may be controlled according to the necessary height increase amount of the local correction position on the frontside surface 300F of the photomask 300. In some embodiments, the thickness change amount ΔTH1 or the thickness reduction amount ΔTM1 may be controlled by the energy beam EB1 applied to the backside surface region P1. For example, the thickness change amount ΔTH1 or the thickness reduction amount ΔTM1 may be determined by controlling the power of the energy beam EB1. The photomask C300 with a thickness variation effectively corrected may be obtained by suitably controlling the thickness change amount ΔTH1 or the thickness reduction amount ΔTM1.

In some embodiments, the energy beam EB1 may be a laser beam. For example, the density of at least a portion of the energy receiving layer 380 among the portion included in the vertical region A1 may be increased by irradiating a laser beam onto the backside surface region P1 and heat-treating the vertical region A1 in the thickness direction of the photomask 300 from the backside surface region P1. Since the density of at least a portion of the energy receiving layer 380 in the vertical region A1 is increased, the energy receiving layer 380 in the vertical region A1 may include a portion having a reduced volume.

When the energy receiving layer 380 includes a single layer or a multilayer including an amorphous Si layer, a laser beam is irradiated onto a selected point SP1 such that the temperature of the vertical region A1 in the thickness direction of the photomask 300 from the backside surface region P1 of the photomask 300 increases up to at least a melting point of Si. Accordingly, a heat-vulnerable Si layer is crystallized, forms a metal silicide by reacting to a surrounding metal material, or is diffused into another surrounding material layer. Therefore, the thickness of the energy receiving layer 380 in the vertical region A1 is reduced, and the height of the top surface of the photomask in the vertical region A1 on the frontside surface 300F of the photomask 300 is increased in the thickness direction, and thus the height of the top surface of the non-flat portion NF may be increased to the same level or substantially the same level as the top surface of the surrounding flat portion F.

In some embodiments, by applying the energy beam EB1 to the backside surface P1, a stress may be generated in and around the vertical region A1. The generated stress may increase the height of the top surface of the non-flat portion NF in a correction target portion on the frontside surface 300F of the photomask 300 to reach the same level or substantially the same level as the top surface of another flat portion nearby or to reduce the difference in heights of the non-flat portion NF and another flat portion.

Figure 8B:
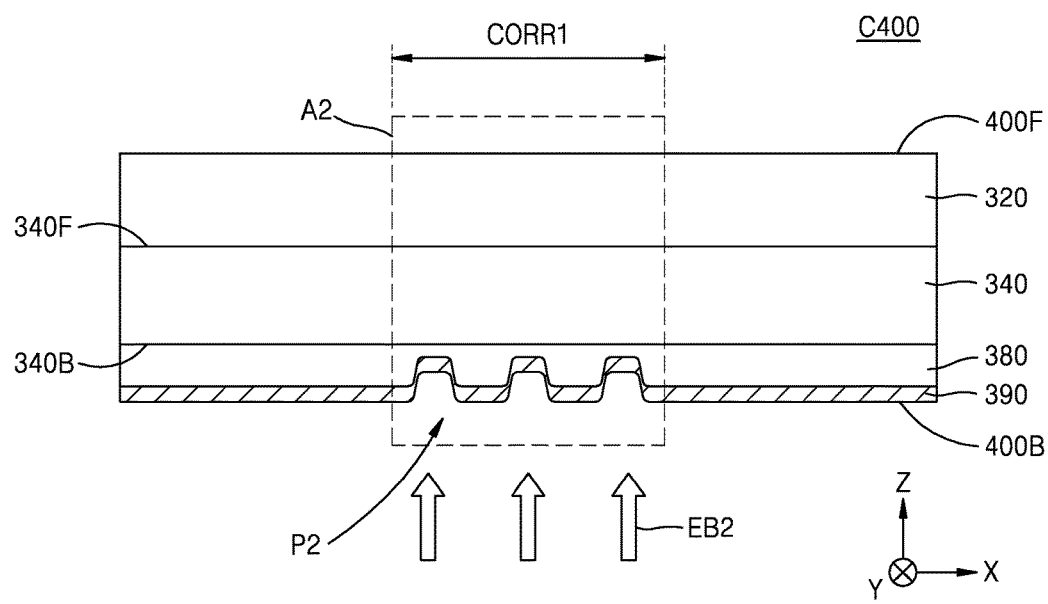
FIG. 8B is a cross-sectional view illustrating another exemplary method of correcting an error at a local correction position in the photomask illustrated in FIG. 8A by a photomask error correcting method according to an embodiment of the inventive concept.

FIG. 8B is a cross-sectional view illustrating another exemplary method of correcting an error at a local correction position in the photomask 400 illustrated in FIG. 8A by step S18 of FIG. 3.

Referring to FIGS. 8A and 8B, the correction range CORR1 selected from the concave surface CCV of the frontside surface 400F of the photomask 400 is selected as a local correction position, and an energy beam EB2 may be locally applied to at least one point selected from the backside surface region P2 aligned with the concave surface CCV in the correction range CORR1 in the thickness direction (Z direction in FIGS. 8A and 8B) of the photomask 400. FIG. 8B illustrates a case where the energy beam EB2 is applied to three points selected from the backside surface region P2. However, this is merely an example that may be seen from the cross-sectional view of FIG. 8B, and the energy beam EB2 may be locally applied to more positions in a plan view of the backside surface region P2 of the photomask 400. The application positions and the number of application positions of the energy beam EB2 selected from the backside surface region P2 may be selected variously according to embodiments.

The energy beam EB2 may be an electron beam, a focused ion beam, a latter beam, or an electromagnetic beam. In order to obtain a photomask C400 with a flatness error effectively corrected as illustrated in FIG. 8B by correcting the concave surface CCV of the frontside surface 400F of the photomask 400, the energy beam EB2 having various levels of power may be applied according to the application positions of the energy beam EB2 selected from the backside surface region P2.

As illustrated in FIG. 8B, when the energy beam EB2 is locally applied to the backside surface region P2, portions of the energy receiving layer 380 corresponding to the portions to which the energy beam EB2 is applied is physically deformed by absorbing energy received from the outside thereof. The physical deformation of the energy receiving layer 380 may cause various stresses in the photomask 400. The stress may be transferred from the backside surface region P2 to the local correction position of the frontside surface 400F in the thickness direction of the photomask 400.

The physical deformation of the energy receiving layer 380 may be accompanied with the thickness reduction of the energy receiving layer 380. Since the thickness of the portion corresponding to the backside surface region P2 among the energy receiving layer 380 is reduced, the height of the top surface of the concave surface CCV at the local correction position of the frontside surface 400F of the photomask 400 is corrected in an increasing direction, the top surface of the frontside surface 400F of the photomask 400 including the concave surface CCV becomes substantially flat, and the photomask C400 with a flatness error corrected may be obtained as illustrated in FIG. 7B. A vertical region A2 corresponding to the backside surface region P2 of the corrected photomask C400 onto which the energy beam EB2 is irradiated may include a portion that is physically deformed by the energy beam EB1.

In some embodiments, the thickness of the energy receiving layer 380 in the vertical region A2 may be reduced. In other embodiments, when the energy receiving layer 380 includes an amorphous material, a portion corresponding to the position where the energy beam EB2 is irradiated from among the amorphous material included in the energy receiving layer 380 may be crystallized.

When the energy beam EB2 is irradiated onto a plurality of positions in the backside surface region P2, a flatness error correction degree in the photomask 400 may be determined by controlling the power of the energy beam EB2.

In some embodiments, the energy beam EB2 may be a laser beam. For example, the density of at least a portion of the energy receiving layer 380 among the portion included in the vertical region A2 may be increased by irradiating a laser beam onto the backside surface region P2 and heat-treating the vertical region A2 in the thickness direction of the photomask 400 from the backside surface region P2. Since the density of at least a portion of the energy receiving layer 380 in the vertical region A2 is increased, the energy receiving layer 380 in the vertical region A2 may include a portion having a reduced volume.

When the energy receiving layer 380 includes a single layer or a multilayer including an amorphous Si layer, a laser beam is irradiated onto the backside surface region P2 such that the temperature of a portion onto which the laser beam is irradiated from among the energy receiving layer 380 included in the vertical region A1 increases up to at least a melting point of Si. Accordingly, a heat-vulnerable Si layer is crystallized, forms a metal silicide by reacting to a surrounding metal material, or is diffused into another surrounding material layer. Therefore, the thickness of the energy receiving layer 380 in the vertical region A2 is reduced, and thus the frontside surface 400F of the photomask 400 may be corrected in a flattening direction by a stress change or the energy transferred to the frontside surface 400F of the photomask 400.

Figure 9B:
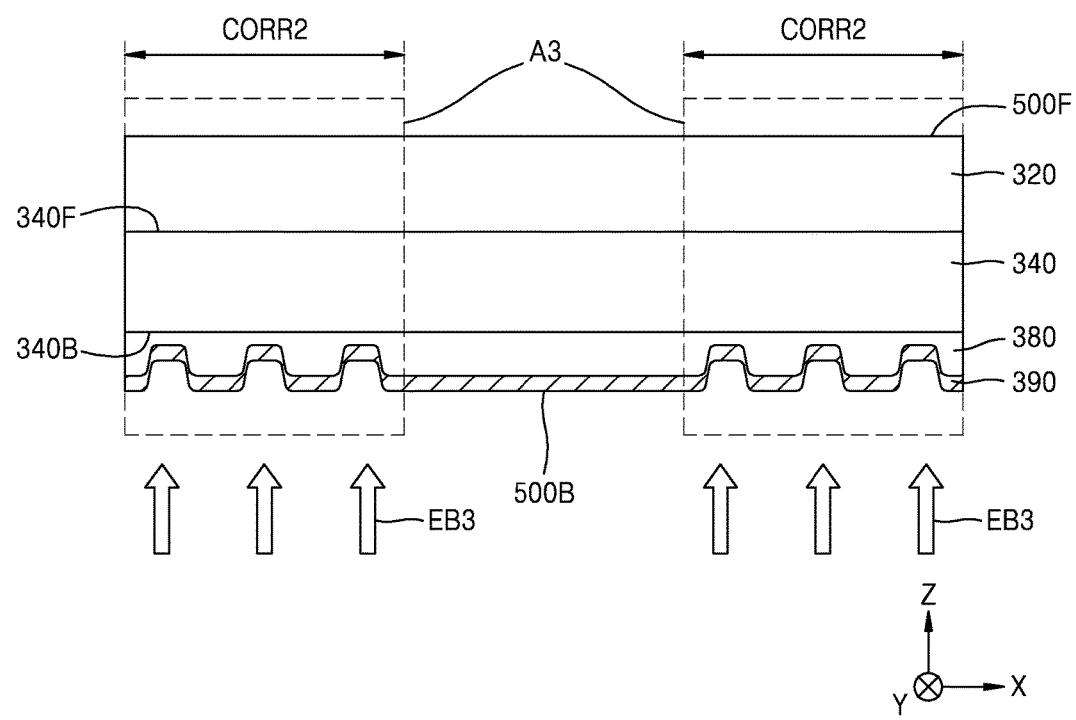
FIG. 9B is a cross-sectional view illustrating another exemplary method of correcting an error at a local correction position in the photomask illustrated in FIG. 9A by a photomask error correcting method according to an embodiment of the inventive concept.

FIG. 9B is a cross-sectional view illustrating another exemplary method of correcting an error at a local correction position in the photomask 500 illustrated in FIG. 9A by step S18 of FIG. 3.

Referring to FIGS. 9A and 9B, the correction range CORR2 selected from the convex surface CVX of the frontside surface 500F of the photomask 500 is selected as a local correction position, and an energy beam EB3 may be locally applied to at least one point selected from the backside surface region P3 aligned with the convex surface CVX in the correction range CORR2 in the thickness direction (Z direction in FIGS. 9A and 9B) of the photomask 500. FIG. 9B illustrates a case where the energy beam EB3 is applied to three points selected from the backside surface region P3. However, this is merely an example that may be seen from the cross-sectional view of FIG. 9B, and the energy beam EB3 may be applied to more positions in a plan view of the backside surface region P3 of the photomask 500. The application positions and the number of application positions of the energy beam EB3 selected from the backside surface region P3 may be selected variously according to embodiments.

The energy beam EB3 may include an electron beam, a focused ion beam, a laser beam, or an electromagnetic beam. In order to obtain a photomask C500 with a flatness error effectively corrected as illustrated in FIG. 9B by correcting the convex surface CVX of the frontside surface 500F of the photomask 500, the energy beam EB3 having various levels of power may be applied according to the application positions of the energy beam EB3 selected from the backside surface region P3.

As illustrated in FIG. 9B, when the energy beam EB3 is locally applied to the backside surface region P3, portions of the energy receiving layer 380 corresponding to the portions to which the energy beam EB3 is applied are physically deformed by absorbing energy received from the outside. The physical deformation of the energy receiving layer 380 may cause various stresses in the photomask 500. The stress may be transferred from the backside surface region P3 to the local correction position of the front side surface 500F in the thickness direction of the photomask 500.

The physical deformation of the energy receiving layer 380 may be accompanied with the thickness reduction of the energy receiving layer 380. Since the thickness of the portion corresponding to the backside surface region P3 among the energy receiving layer 380 is reduced, the height of the top surface of the portion having a relatively low top surface around the convex surface CVX at the local correction position of the frontside surface 500F of the photomask 500 is corrected in an increasing direction, the top surface of the frontside surface 500F of the photomask 500 including the convex surface CVX becomes substantially flat, and the photomask C500 with a flatness error corrected may be obtained as illustrated in FIG. 9B. A vertical region A3 of the corrected photomask C500 corresponding to the position onto which the energy beam EB3 is irradiated may include a portion that is physically deformed by the energy beam EB3.

In some embodiments, the thickness of the energy receiving layer 380 at the position in the vertical region A3 onto which the energy beam EB3 is irradiated may be reduced. In other embodiments, when the energy receiving layer 380 includes an amorphous material, a portion corresponding to the position where the energy beam EB3 is irradiated from among the amorphous material included in the energy receiving layer 380 may be crystallized.

When the energy beam EB3 is irradiated onto a plurality of positions in the backside surface region P3, a flatness error correction degree in the photomask 500 may be determined by controlling the power of the energy beam EB3.

In some embodiments, the energy beam EB3 may be a laser beam. For example, the density of at least a portion of the energy receiving layer 380 among the portion included in the vertical region A3 may be increased by irradiating a laser beam onto the backside surface region P3 and heat-treating the vertical region A3 in the thickness direction of the photomask 500 from the backside surface region P3. Since the density of at least a portion of the energy receiving layer 380 in the vertical region A3 is increased, the energy receiving layer 380 in the vertical region A3 may include a portion having a reduced volume.

When the energy receiving layer 380 includes a single layer or a multilayer including an amorphous Si layer, a laser beam is irradiated onto the backside surface region P3 such that the temperature of in the vertical region A3 in the thickness direction of the photomask 500 from the backside surface region P3 of the photomask 500 increases up to at least a melting point of Si. Accordingly, a heat-vulnerable Si layer is crystallized, forms a metal silicide by reacting to a surrounding metal material, or is diffused into another surrounding material layer. Therefore, the thickness of the energy receiving layer 380 in the vertical region A3 is reduced, and thus the frontside surface 500F of the photomask 500 may be corrected in a flattening direction by a stress change or the energy transferred to the frontside surface 500F of the photomask 500.

As an example of the method of correcting an error at the local correction position according to step S18 of FIG. 3, a method of correcting a thickness variation or a flatness error has been exemplarily described with reference to FIGS. 7A to 9B. However, when an error at the local correction position is corrected according to step S18 of FIG. 3, various errors (such as a CDU error, an imaging error, and a registration error) in the photomask may be effectively corrected by processes and according to principles similar to those described with reference to FIGS. 7A to 9B.

For example, when the error detected in step S14 of FIG. 3 is a registration error represented by the two-dimensional map 230 illustrated in FIG. 6, a shift direction of each pattern element on the photomask from its nominal position is detected from the two-dimensional map 230, and a portion of the backside surface region is physically deformed by applying an energy beam to at least one point in the backside surface region selected corresponding to the local correction position on the backside surface of the photomask by the method similar to that described with reference to FIGS. 7B, 8B, and 9B. Accordingly, a strain of the photomask at the position of each pattern element on the frontside surface of the photomask may be changed. The energy beam may be an electron beam, a focused ion beam, a laser beam, or an electromagnetic beam.

In some embodiments, there may be one selected point or a plurality of selected points for applying a physical deformation to the backside surface region selected corresponding to the local correction position on the backside surface of the photomask. The plurality of selected points may be selected such that physical deformation regions caused by the energy beam applied to the plurality of selected points are connected continuously (e.g., form a single line or curve) or intermittently. Since a physical deformation is applied to the backside surface region of the photomask, a stress is generated in a partial region of the frontside surface of the photomask, and the generated stress may change a strain to the positions of the pattern elements of a registration error correction target. As a result, a registration error of the photomask may be corrected.

Among the photomasks according to the embodiments of the inventive concept, the photomasks including the energy receiving layers C182, C184, C186 and C188 illustrated in FIGS. 2B, 2D, 2F and 2H may correspond to a structure obtained by applying an energy beam to the backside surface region aligned with the local correction position on the frontside surface of the photomask, in order to correct various errors of the photomask according to step S18 of FIG. 3. For example, the photomasks C300, C400, and C500 illustrated in FIGS. 7B, 8B, and 9B may include the energy receiving layers C182, C184, C186 and C188 illustrated in FIGS. 2B, 2D, 2F and 2H.

Figure 10A:
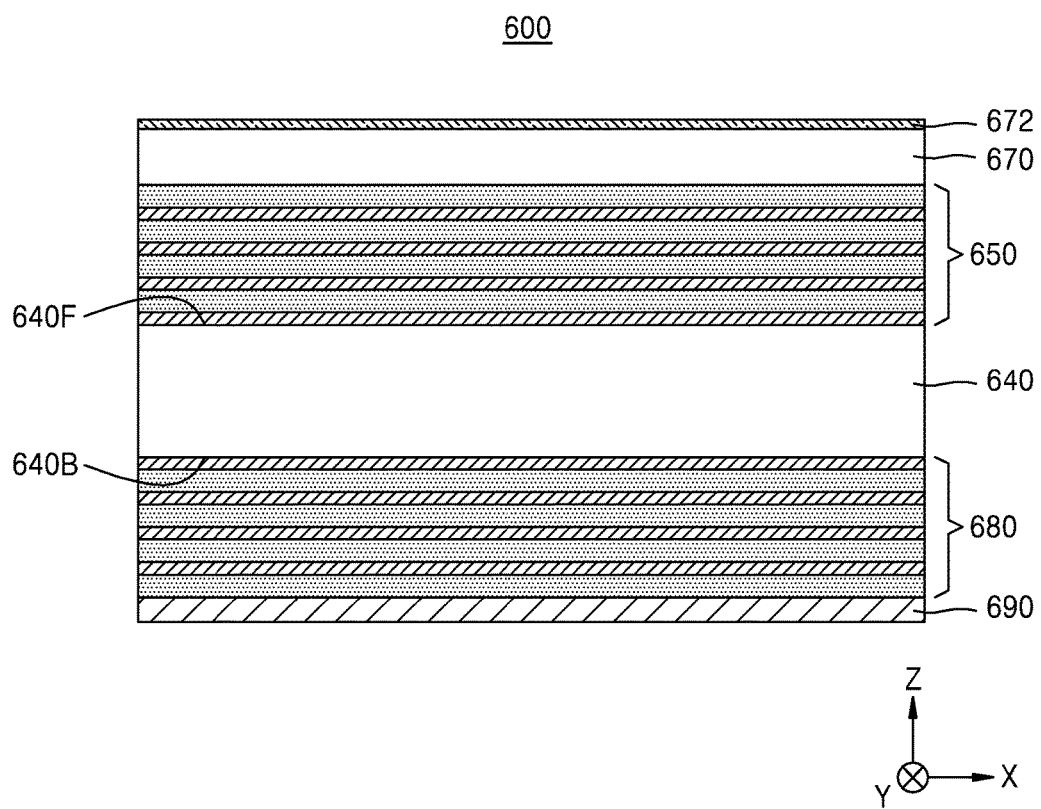
FIGS. 10A to 10C are diagrams illustrating an estimation example of correcting a thickness variation in a photomask by a photomask error correcting method according to embodiments of the inventive concept.
Figure 10B:
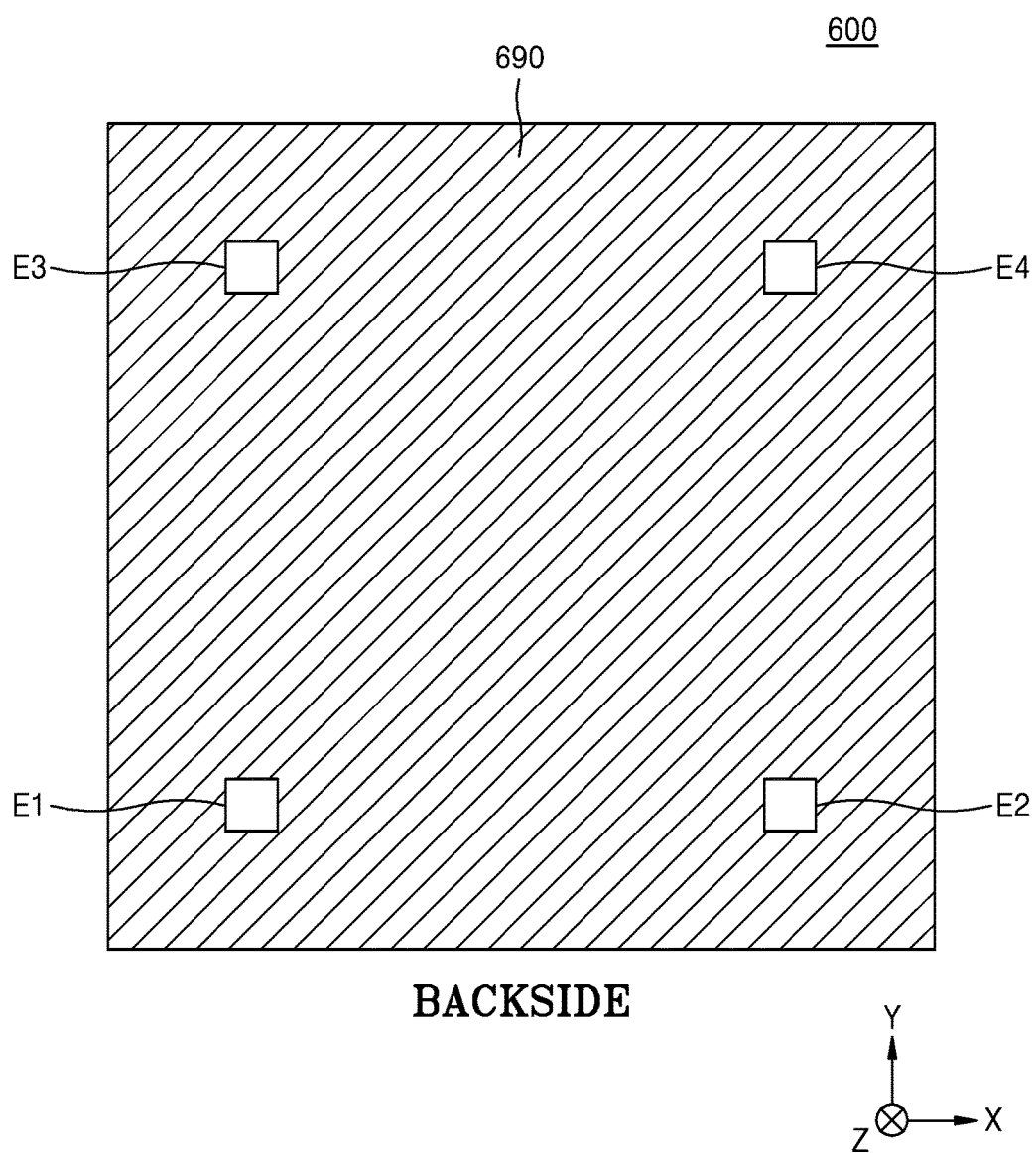
Figure 10C:
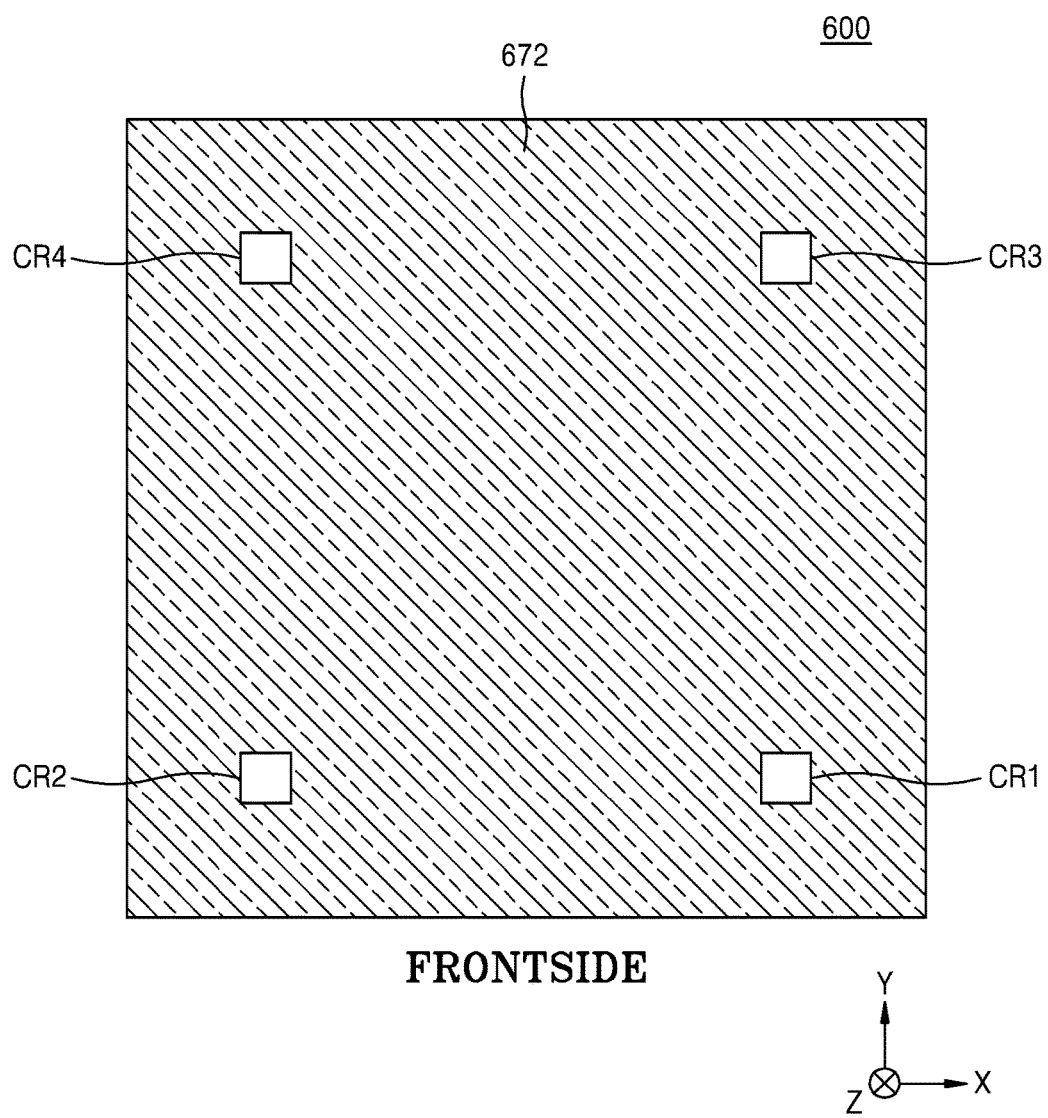

FIGS. 10A to 10C are diagrams illustrating an estimation example in which a thickness variation in a photomask 600 is corrected by a photomask error correcting method according to embodiments of the inventive concept.

For the estimation, as illustrated in FIG. 10A, a multilayer reflection film 650 including a Mo/Si 40 cycle of multilayer, a light absorber layer 670 including TaBN, and a low-reflection layer 672 including TaBO are sequentially formed on a first surface 640F of a photomask substrate 640. Then, an energy receiving layer 680 including a Mo/Si 40 cycle of multilayer, and a CrN backside conductive film 690 covering the energy receiving layer 680 are sequentially formed on a second surface 640B of the photomask substrate 640 to form the photomask 600 to be corrected.

FIG. 10B is a plan view illustrating first to fourth positions E1, E2, E3, and E4 at which laser beams are irradiated onto the backside surface of the photomask 600 illustrated in FIG. 10A, where the backside conductive film 690 is exposed.

First to fourth positions E1, E2, E3, and E4 are selected from the backside surface where the backside conductive film 690 of the photomask 600 is exposed, and a laser beam is applied to the first to fourth positions E1, E2, E3, and E4 such that thickness reduction amounts at the first to fourth positions E1, E2, E3, and E4 are respectively about 10 nm, about 20 nm, about 30 nm, and about 40 nm.

When the laser beam is applied to the first to fourth positions E1, E2, E3, and E4, the power of the laser beam may be controlled within a range of about 20 W to about 80 W to control the dose of the laser beam, a laser pulse time is about 0.5 ms, and a laser beam size is about 300 μm×300 μm. In order to obtain various thickness reduction amounts as illustrated above, the energy density of the laser beam may be controlled within a range of about 1 J/cm² to about 5 J/cm² while the laser beam is applied to the first to fourth positions E1, E2, E3, and E4 of the photomask 600.

FIG. 10C is a front plan view of the photomask 600, which illustrates results of correcting a thickness variation by the method described with reference to FIG. 10B.

Referring to FIG. 10C, as a result of applying the laser beam to the first to fourth positions E1, E2, E3, and E4 selected from the backside surface of the photomask by the method described with reference to FIG. 10B, the thicknesses of first to fourth correction positions CR1, CR2, CR3, and CR4 corresponding to the first to fourth positions E1, E2, E3, and E4 in the thickness direction (Z direction in FIGS. 10A to 10C) of the photomask 600 among the front side surface, where the low-reflection layer 672 of the photomask 600 is to be irradiated, are increased by about 6 nm, about 25 nm, about 38 nm, and about 42 nm respectively.

From the estimation example illustrated in FIGS. 10A to 10C, it may be seen that a local thickness variation of the photomask may be corrected by the photomask error correcting method according to the inventive concept.

Figure 11A:
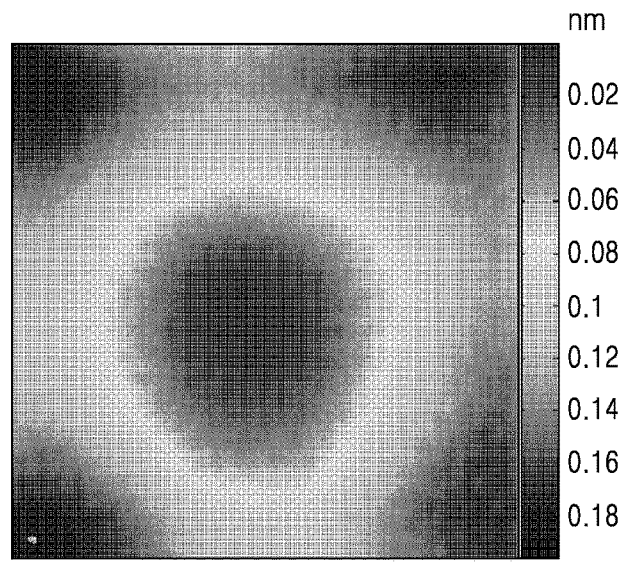
FIGS. 11A and 11B are diagrams illustrating un example of correcting a flatness error in a photomask by a photomask error correcting method according to an embodiment of the inventive concept.
Figure 11B:
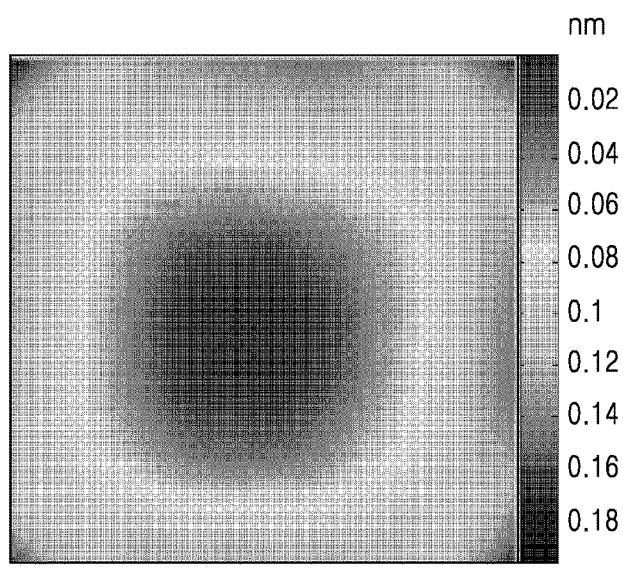

FIGS. 11A and 11B are diagrams illustrating an example of correcting a flatness error in a photomask by a photomask error correcting method according to an embodiment of the inventive concept.

The photomask having the same structure as the photomask 600 described with reference to FIG. 10A is used as a photomask to be error-corrected for estimation of FIGS. 11A and 11B, and Tropel UltraFlat (manufactured by Corning Tropel) is used as a flatness measuring device for flatness estimation.

FIG. 11A illustrates results of measuring flatness on a frontside surface of a photomask to be error-corrected before a flatness error of the photomask is corrected. In FIG. 11A, a center portion of the photomask is the highest and four edges portions are lower then the center portion. In FIG. 11A, a peak-to-valley (P-V) non-flatness before flatness error correction is about 198 nm, and a distribution (3 sigma) is about 146 nm.

FIG. 11B illustrates results of setting a backside surface region where a laser beam will be irradiated in the center portion of the photomask by a method similar to that described with reference to FIG. 8B, correcting a flatness error by locally applying a laser beam to a plurality of points selected from the backside surface region by the method described with reference to FIG. 10B, and then measuring the flatness on the frontside surface of the photomask. In FIG. 11B, a P-V non-flatness after the flatness error correction is about 162 nm, and a distribution is about 126 nm. Thus, the peak to valley non-flatness and the distribution are both reduced. Peak to valley non-flatness refers to the maximum difference of the surface height of the surface layer of interest (e.g., the difference of the highest and lowest points of the surface of the reflective film 150 of the photomask).

It may be seen from FIG. 11B that the heights of the four edge portions of the photomask are increased than those before error correction as a result of performing annealing by locally irradiating the laser beam to a partial region on the backside of the photomask, and the flatness and thickness distribution on the frontside of the photomask may be corrected by the photomask error correcting method according to the inventive concept.

The photomask error correcting methods described herein according to the inventive concept may be performed to correct errors of a photomask blank. Alternatively, a light absorber layer included in the photomask blank may be patterned to form a photomask having a desired light absorber pattern, for example, the light absorber pattern 170P illustrated in FIG. 1A, to complete a photomask including desired pattern elements, and then the photomask error correcting method according to the inventive concept may be performed on the completed photomask. Also, the photomask error correcting method according to the inventive concept may be performed repeatedly before or after an exposure process in an integrated circuit manufacturing process. For example, before an exposure process is performed on a wafer in a lithography system, the error correcting method according to the inventive concept may be performed on the photomask to be used in the exposure process. Alternatively, an exposure process may be performed at least one time on a wafer by using a photomask, a pattern on the wafer formed by the exposure process may be estimated, an error of the photomask used in the exposure process may be corrected according to the estimation results by the error correcting method according to the inventive concept, and an exposure process may be performed on the wafer by using the error-corrected photomask.

Figure 12:
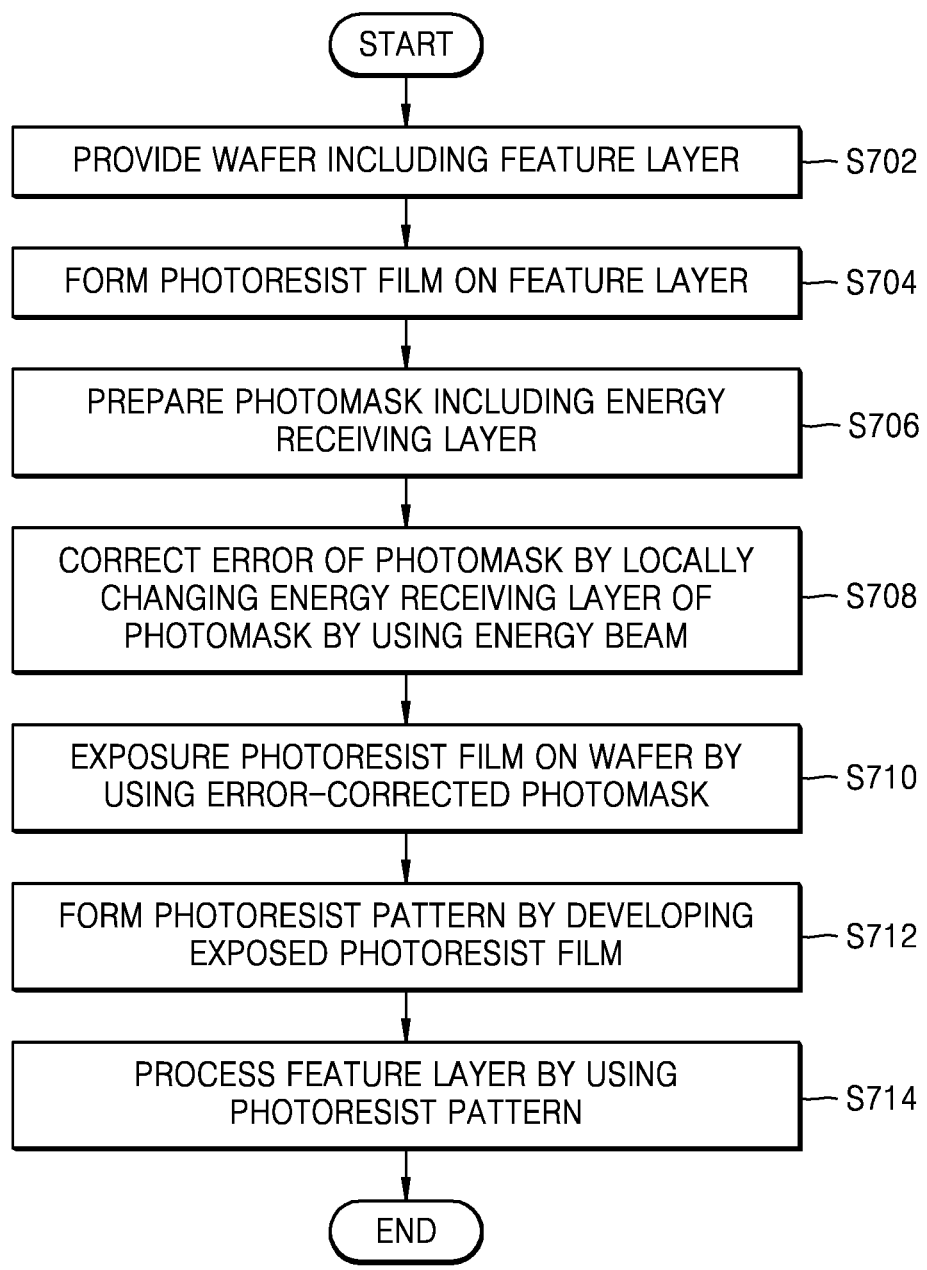
FIG. 12 is a flowchart of a method of manufacturing an integrated circuit device, according to some embodiments of the inventive concept.

FIG. 12 is a flowchart of a method of manufacturing an integrated circuit device, according to some embodiments of the inventive concept.

Referring to FIG. 12, in step S702, a wafer including a feature layer is provided.

In some embodiments, the feature layer may be a conductive layer or an insulating layer formed on semiconductor substrate (e.g., forming a substrate of a wafer). For example, the feature layer may include a metal, a semiconductor, or an insulating material. In other embodiments, the feature layer may be the semiconductor substrate itself.

In step S704, a photoresist film is formed on the feature layer. In some embodiments, the photoresist film may include an EUV (about 13.5 nm) resist material. In other embodiments, the photoresist film may include a $F_2$ excimer laser (about 157 nm) resist, an ArF excimer laser (about 193 nm) resist, or a KrF excimer laser (about 248 nm) resist. The photoresist film may include a positive photoresist or a negative photoresist.

In some embodiments, in order to form the photoresist film including the positive photoresist, a photoresist composition including a solvent, a potential acid, and a photosensitive polymer having an acid-labile group may be spin-coated on the feature layer.

In some embodiments, the photosensitive polymer may include a (meth) acrylate-based polymer. The (meth) acrylate-based polymer may be an aliphatic (meth) acrylate-based polymer. For example, the photosensitive polymer may be polymethylmethacrylate (PMMA), poly(t-butylmethacrylate), poly(methacrylic acid), poly(norbornylmethacrylate), of a copolymer or terpolymer of (meth) acrylate-based polymers, or any mixture thereof. Also, the photosensitive polymers described above may be substituted with various acid-labile protecting groups. The protecting groups may include tertbutoxycarbonyl (t-BOC), tetrahydropyranyl, trimethylsilyl, phenoxyethyl, cyclohexenyl, tert-butoxycarbonylmethyl, tert-butyl, adamantyl, or norbornyl group. However, the inventive concept is not limited thereto.

In some embodiments, the potential acid may include a photoacid generator (PAG), a thermoacid generator (TAG), or a combination thereof. In some embodiments, the PAG may include a material that generates an acid when exposed to any one of the group of EUV light (about 1 nm to about 31 nm), $F_2$ excimer laser (about 157 nm), ArF excimer laser (about 193 nm), and KrF excimer laser (about 248 nm). The PAG may include onium salt, halogen compound, nitrobenzyl esters, alkyl sulfonates, diazo naphthoquinones, imino sulfonates, disulfones, diazo methanes, or sulfonyloxyketones.

In step S706, a photomask including an energy receiving layer is prepared.

In some embodiments, the photomask may be any one of the photomask 100 described with reference to FIGS. 1A and 1B and the photomasks 300, 400, 500, and 600 described with reference to FIGS. 7A, 8A, 9A, and 10A. In the photomask 100 described with reference to FIGS. 1A and 1B, the energy receiving layer 180 may have a structure of any one of the energy receiving layers 182, 184, 186 and 188 illustrated in FIGS. 2A, 2C, 2E and 2G. In some embodiments, a manufacturer (such as a integrated circuit manufacturer) may receive a blank mask from a photomask vendor, where light absorber layer 170 is initially unpatterned (along with the low reflection layer 172 and buffer layer 162 being unpatterned). The manufacturer may then pattern the light absorber layer 170 to obtain the light absorber pattern 170P. The low reflection layer 172 and buffer layer 162 may also be patterned at this time and may define the patterns of the photomask, such as the main pattern elements 112 of the main pattern region 110 and/or the auxiliary pattern elements 122 in the auxiliary pattern region 120. The patterned photomask may then be corrected as described below.

In step S708, an error of the photomask is corrected by locally changing the energy receiving layer of the photomask by using an energy beam.

In some embodiments, in order to locally change the energy receiving layer, an energy beam may be locally applied to the photomask on the backside of the photomask to locally heat the energy receiving layer to physically change a partial region of the energy receiving layer.

The error corrected in step S708 may be at least one of a flatness error, a thickness variation, a CDU error, an imaging error, and a registration error, but is not limited thereto.

In some embodiments, the energy receiving layer of the photomask after the photomask error correction may have a structure of any one of the energy receiving layers C182, C184, C186 and C188 illustrated in FIGS. 2B, 2D, 2F and 2H. In other embodiments, the photomask may have a structure of any one of the photomasks C300, C400, and C500 illustrated in FIGS. 7B, 8B, and 9B.

The photomask error correcting method described with reference to FIGS. 3 and 7A to 9B may be used to correct an error of the photomask in step S708.

In step S710, the photoresist film formed in step S704 is exposed in a reflective exposure system by using the photomask that is error-corrected in step S708.

In some embodiments, in the exposure process, the photoresist film may be exposed to EUV light reflected from the photomask that is error-corrected in step S708.

In the exposure process, the photoresist film may be exposed to EUV light reflected from a multilayer reflection film of the error-corrected photomask, for example, the multilayer reflection film 150 of the photomask 100 illustrated in FIG. 1B.

In step S712, the exposed photoresist film is developed to form a photoresist pattern.

In step S714, the photoresist pattern is used to process the feature layer.

In some embodiments, in order to process the feature layer according to step S714, the photoresist pattern may be used as an etch mask to etch the feature layer to form a feature pattern.

In other embodiments, in order to process the feature layer according to step S714, the photoresist pattern may be used as an ion implantation mask to implant impurity ions into the feature layer.

In other embodiments, in order to process the feature layer according to step S714, a separate process film may be formed on the feature layer that is exposed through the photoresist pattern formed in step S712. The process film may include a conductive film, an insulating film, a semiconductor film, or any combination thereof.

Figure 13:
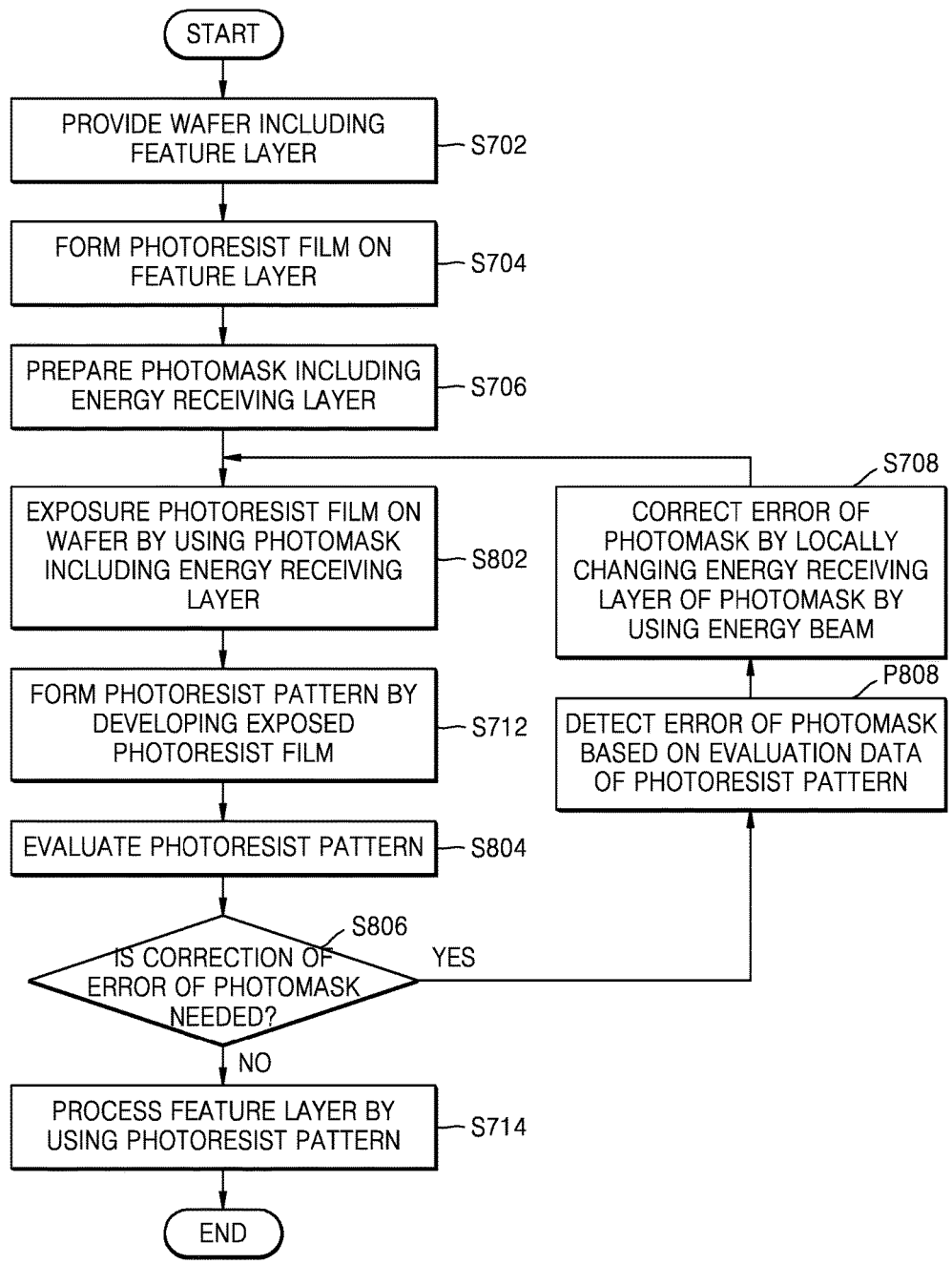
FIG. 13 is a flowchart of a method of manufacturing an integrated circuit device, according to other embodiments of the inventive concept.

FIG. 13 is a flowchart of a method of manufacturing an integrated circuit device, according to other embodiments of the inventive concept.

First, processes P720, P704, and P706 described with reference to FIG. 12 are sequentially performed.

In step S802, the photomask including the energy receiving layer prepared in step S706 is used to expose the photoresist film on the wafer. The exposure process is substantially identical to the exposure process in step S710 of FIG. 12. However, the photomask error correction of process 708 in FIG. 12 may not be performed on the photomask including the energy receiving layer.

After step S802, the photoresist film exposed is developed in step S712 to form a photoresist pattern. Step S712 may be performed in the same method as described with reference to FIG. 12.

In step S804, it is determined whether the photoresist pattern formed through step S712 has an error.

In some embodiments, information about flatness or topography of the frontside surface of the photomask prepared in step S706 may be obtained based on evaluation results obtained in step S804, such as from measurement data of the photoresist pattern (e.g., a deviation of pattern sizes or pattern locations of the photoresist pattern).

An optical method may be used to determine whether the photoresist pattern has an error in step S804. In some embodiments, an AFM, a SEM, a TEM, or an interferometer may be used to optically determine whether the photoresist pattern has an error; however, the inventive concept is not limited thereto.

The photoresist pattern determination according to step S804 may be performed in-situ in the lithography system or may be performed ex-situ outside the lithography system.

In the photoresist pattern determination according to step S804, a CDU of the photoresist pattern and width dimensions of patterns may be determined. In some embodiments, the determination results of the photoresist pattern may be obtained as two-dimensional data or three-dimensional data.

In step S806, whether an error correction of the photomask used in the exposure process of step S802 is necessary is determined based on the determination data obtained through step S804.

When an error correction of the photomask is necessary as a result of the step S806, an error of the photomask to be corrected is detected based on the determination data of the photoresist pattern obtained through step S804.

The error of the photomask detected in step S808 may be a flatness error, a thickness variation, a CDU, or a registration error, but is not limited thereto. Various errors of the photomask described with reference to step S14 of FIG. 3 may be detected in step S808.

After detection of the error of the photomask, in step S708, the error of the photomask is corrected by locally changing the energy receiving layer of the photomask by using an energy beam. The details of step S708 are the same as described with reference to FIG. 12.

After correction of the error of the photomask, an exposure process according to step S802 is performed. In this case, a photomask that is error-corrected through step S708 is used as the photomask.

Thereafter, step S712 and step S804 are performed, and the above processes are repeated until the error correction of the photomask is determined to be unnecessary in step S806.

When the error correction of the photomask is determined to be unnecessary in step S806, the feature layer is processed in step S714 by using the photoresist pattern obtained through step S712. The details of the feature layer processing method according to step S714 may be the same as described with reference to FIG. 12.

Figure 14:
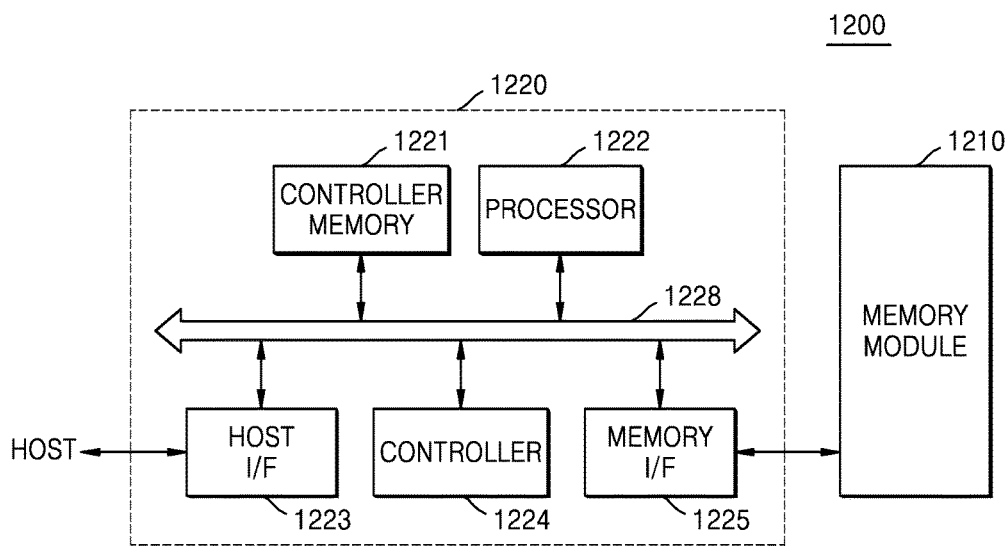
FIG. 14 is a block diagram of a memory card including an integrated circuit device manufactured by an integrated circuit device manufacturing method according to embodiments of the inventive concept.

FIG. 14 is a block diagram of a memory card 1200 including an integrated circuit device manufactured by the integrated circuit device manufacturing method according to embodiments of the inventive concept.

Referring to FIG. 14, the memory card 1200 includes a memory controller 1220 generating a command/address signal C/A, and a memory module 1210, for example, a flash memory including one or more flash memory devices. The memory controller 1220 includes a host interface 1223 transmitting/receiving a command/address signal to/from a host, and a memory interface 1225 transmitting/receiving a command/address signal to/from the memory module 1210. The host interface 1223, a controller 1224, and the memory interface 1225 communicate with a controller memory 1221, such as a static random-access memory (SRAM), and a processor 1222, such as a central processing unit (CPU), through a common bus 1228.

The memory module 1210 receives a command/address signal from the memory controller 1220, and in response thereto, stores/reads data into/from at least one of memory devices of the memory module 1210. Each of the memory devices includes a plurality of addressable memory cells, and a decoder receiving a command/address signal and generating a row signal and a column signal for accessing at least one of the addressable memory cells in a program/read operation.

The respective components of the memory card 1200 including the memory controller 1220; the electronic devices 1221, 1222, 1223, 1224, and 1225 included in the memory controller 1220; and the memory module 1210 may include an integrated circuit device (e.g., an integrated circuit device embodied by a semiconductor chip) that is manufactured by the integrated circuit device manufacturing method according to embodiments of the inventive concept. For example, the integrated circuit device(s) may be made by forming a photomask as described herein, irradiating the photomask to form a pattern in a layer of an integrated circuit (e.g., a photoresist that is subsequently used to process layers deposited on a semiconductor substrate or the semiconductor substrate of the integrated circuit device). Also, the respective components of the memory card 1200 including the memory controller 1220; the electronic devices 1221, 1222, 1223, 1224, and 1225 included in the memory controller 1220; and the memory module 1210 may include an integrated circuit device that is manufactured by using any one of the photomask 100 described with reference to FIGS. 1A and 1B, the photomasks 300, 400, 500, and 600 described with reference to FIGS. 7A, 8A, 9A, and 10A, the photomasks C300, C400, and C500 illustrated in FIGS. 7B, 8B, and 9B, and the photomask including an energy receiving layer having the same structure as any one of the energy receiving layers 182, C182, 184, C184, 186, and C186 illustrated in FIGS. 2A to 2H.

Figure 15:
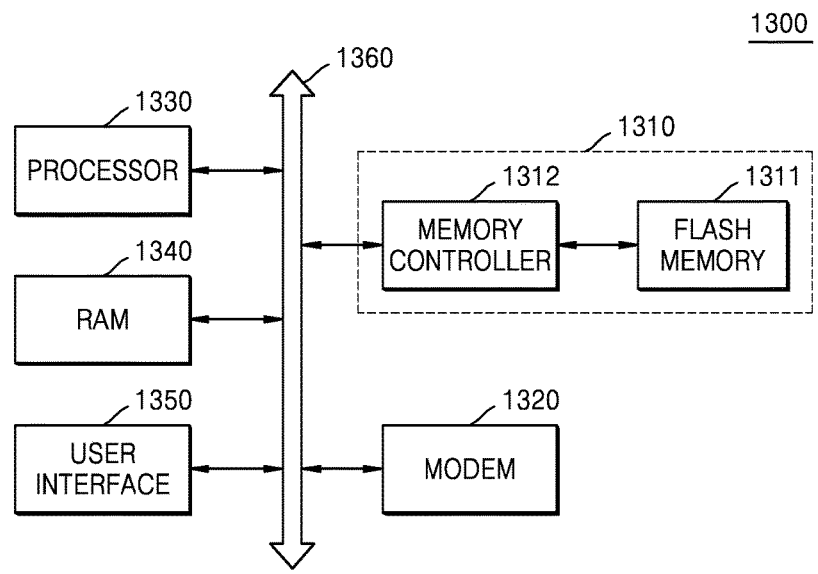
FIG. 15 is a block diagram of a memory system including a memory card including an integrated circuit device manufactured by an integrated circuit device manufacturing method according to embodiments of the inventive concept.

FIG. 15 is a block diagram of a memory system 1300 including a memory card 1310 including an integrated circuit device manufactured by the integrated circuit device manufacturing method according to embodiments of the inventive concept.

The memory system 1300 may include a processor 1330 such as a CPU, a random-access memory (RAM) 1340, a user interface 1350, and a modem 1320 that communicate through a common bus 1360. The processor 1330, the RAM 1340, the user interface 1350, and the modem 1320 transmit/receive signals to/from the memory card 1310. The respective components of the memory system 1300 including the memory card 1310, the processor 1330, the RAM 1340, the user interface 1350, and the modem 1320 may include an integrated circuit device that is manufactured by the integrated circuit device manufacturing method according to embodiments of the inventive concept. In particular, the respective components of the memory system 1300 may include an integrated circuit device that is manufactured by using any one of the photomask 100 described with reference to FIGS. 1A and 1B, the photomasks 300, 400, 500, and 600 described with reference to FIGS. 7A, 8A, 9A, and 10A, the photomasks C300, C400, and C500 illustrated in FIGS. 7B, 8B, and 9B, and the photomask including an energy receiving layer having the same structure as any one of the energy receiving layers 182, C182, 184, C184, 186, and C186 illustrated in FIGS. 2A to 2H.

The memory system 1300 may be applied in various electronic application fields. For example, the memory system 1300 may be applied to solid state drives (SSDs), complementary metal oxide semiconductor (CMOS) image sensors (CISs), and computer application chip sets.

The memory systems and devices described herein may be packaged in any one of various device package forms such as a ball grid array (BGA), chip scale package (CSP), plastic leaded chip carrier (PLCC), plastic dual in-line package (PDIP), multi-chip package (MCP), wafer-level fabricated package (WFP), and wafer-level processed stock package (WSP); however, the inventive concept is not limited thereto.

While the inventive concept has been particularly shown and described with reference to exemplary embodiments thereof, it will be understood that various changes in form and details may be made therein without departing from the spirit and scope of the following claims. For example, the invention may be applicable to structures other than photomasks that benefit from modification of surface heights or selectively applied stress. For example, the energy receiving layer 180 may be applied to a backside of a mirror that benefits from surface corrections of its reflective surface (e.g., a mirror used as part of an optical projection system of a telescope or microscope). As another example, the embodiments describe the energy receiving layer 180 being applied to a backside surface 140B of a photomask substrate 140. However, the energy receiving layer 180 alternatively may be applied to the front side surface 140F of the photomask substrate 140 or, in another example embodiment, act as the photomask substrate 140 (so that a separate photomask substrate 140 other than the energy receiving layer 180 is unnecessary). As another example, the photomask described herein has been with respect to a reflective photomask. However, the inventive concept is applicable to transmissive photomasks. In such a case, the energy receiving layer may be selectively formed to avoid overlap patterns of the photomask, such as avoiding overlap at main pattern regions 110 of the photomask (e.g., formed at the black border 130 and/or auxiliary regions only 120).

What is claimed is:

1. A photolithographic mask comprising:
   a substrate having a first surface and a second surface on an opposite side of the substrate from the first surface;
   a reflection film on the first surface of the substrate;
   a light absorber layer on the reflection film; and
   a stress inducing layer on the second surface of the substrate, the stress inducing layer configured to have selected locations alter a stress applied to the substrate to alter a shape of the photolithographic mask.

2. The photolithographic mask of claim 1, wherein the stress inducing layer comprises an amorphous material.

3. The photolithographic mask of claim 2, wherein the stress inducing layer comprises crystalline material.

4. The photolithographic mask of claim 1, wherein the stress inducing layer comprises a plurality of layers of a first material and a plurality of layers of a second material each interposed between corresponding ones of the plurality of layers of the first material.

5. The photolithographic mask of claim 4, wherein the first material comprises at least one of Al, Si and K.

6. The photolithographic mask of claim 5, wherein the second material comprises at least one of Nb, Mo, Ru and Pb.

7. The photolithographic mask of claim 4, wherein the first material comprises an amorphous portion and a crystalline portion.

8. The photolithographic mask of claim 4, wherein each layer of the plurality of layers of the first material comprise an amorphous portion and a crystalline portion.

9. The photolithographic mask of claim 8, wherein the crystalline portions of the plurality of layers of the first material provide stress to the substrate.

10. The photolithographic mask of claim 9, wherein each layer of the plurality of layers of the second material comprise an amorphous portion and a crystalline portion.

11. The photolithographic mask of claim 1, wherein the stress inducing layer comprises one or more depressions on a first surface, the one or more depressions corresponding to locations that induce stress on the substrate.

12. The photolithographic mask of claim 1,
    wherein the stress inducing layer comprises a first surface adjacent the second surface of the substrate and a second surface on an opposite side of the stress inducing layer from the first surface,
    wherein the one or more depressions are located on the second surface.

13. The photolithographic mask of claim 12, wherein the stress inducing layer comprises a first material having a crystalline state between each of the one or more depressions and the substrate and having an amorphous state at other locations.

14. The photolithographic mask of claim 12, wherein the stress inducing layer comprises a plurality of layers of a first material and a plurality of layers of a second material each interposed between corresponding ones of the plurality of layers of the first material.

15. The photolithographic mask of claim 14, wherein the first material and the second material have a crystalline state at locations between the one or more depressions and an amorphous state at other locations.

16. The photolithographic mask of claim 1, wherein the light absorbing layer is patterned to include openings to allow light to impinge on and reflect off of the reflection film.

17. The photolithographic mask of claim 1, wherein the stress inducing layer comprises a first material having a crystalline state and having an amorphous state at other locations.

18. The photolithographic mask of claim 17, wherein the crystalline state of the first material exerts stress to the substrate.

* * * * *